(12) United States Patent
Nishimura et al.

(10) Patent No.: US 6,753,124 B2
(45) Date of Patent: Jun. 22, 2004

(54) RADIATION-SENSITIVE RESIN COMPOSITION

(75) Inventors: Yukio Nishimura, Mie (JP); Katsuji Douki, Ithaca, NY (US); Toru Kajita, Mie (JP); Tsutomu Shimokawa, Mie (JP)

(73) Assignee: JSR Corporation, Tokyo (JP)

( * ) Notice: Subject to any disclaimer, the term of this patent is extended or adjusted under 35 U.S.C. 154(b) by 12 days.

(21) Appl. No.: 09/874,977

(22) Filed: Jun. 7, 2001

(65) Prior Publication Data

US 2002/0009667 A1 Jan. 24, 2002

(30) Foreign Application Priority Data

Jun. 9, 2000 (JP) ........................................ 2000-173708
Mar. 29, 2001 (JP) ........................................ 2001-095877

(51) Int. Cl.$^7$ ............................................. G03F 7/004
(52) U.S. Cl. .................... 430/270.1; 430/905; 430/910
(58) Field of Search ............................. 430/270.1, 905, 430/910

(56) References Cited

U.S. PATENT DOCUMENTS

| | | | | |
|---|---|---|---|---|
| 5,968,713 A | * | 10/1999 | Nozaki et al. ............... | 430/326 |
| 6,013,416 A | | 1/2000 | Nozaki et al. ............ | 430/283.1 |
| 6,251,560 B1 | * | 6/2001 | Wallow et al. ........... | 430/270.1 |
| 6,265,131 B1 | * | 7/2001 | Chang et al. ............. | 430/270.1 |
| 6,312,867 B1 | * | 11/2001 | Kinsho et al. ........... | 430/270.1 |
| 6,420,082 B1 | * | 7/2002 | Sato et al. ................ | 430/270.1 |

FOREIGN PATENT DOCUMENTS

| | | |
|---|---|---|
| EP | 102450 | 3/1984 |
| EP | 0 856 773 A1 | 8/1998 |
| EP | 0 982 628 A2 | 3/2000 |
| JP | 04-226461 | 8/1992 |
| JP | 07-234511 | 9/1995 |
| JP | 09-090637 | 4/1997 |
| JP | 10-207069 | 8/1998 |
| JP | 10-239846 | 9/1998 |
| JP | 10-274852 | 10/1998 |
| JP | 10-319595 | 12/1998 |
| JP | 11-012326 | 1/1999 |
| JP | 11222460 | * 8/1999 |
| JP | 11-223950 | 8/1999 |

OTHER PUBLICATIONS

U.S. patent application publication U.S. 2002/0098440 A1, Jul. 25, 2002, Sato et al. for application 09/492,848, Jan. 27, 2000.*

* cited by examiner

*Primary Examiner*—Rosemary Ashton
(74) *Attorney, Agent, or Firm*—Piper Rudnick LLP; Steven B. Kelber

(57) ABSTRACT

A radiation-sensitive resin composition used as a chemically amplified positive tone resist responsive to short wavelength active radiation such as KrF excimer laser and ArF excimer laser is disclosed. The resin composition comprises: (A) an acid-dissociable group-containing resin which is insoluble or scarcely soluble in alkali and becomes alkali soluble when the acid-dissociable group dissociates, the resin comprising a lactone cyclic structure of the following formula (1):

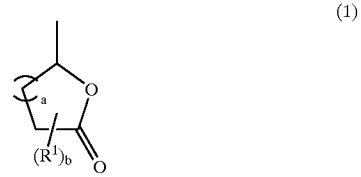

(1)

wherein a is an integer from 1–3, b is an integer from 0–9, and $R^1$ represents a monovalent organic group, and (B) a photoacid generator. The composition has high transmittance of radiation, exhibits high sensitivity, resolution, and pattern shape, and can produce semiconductors at a high yield without producing resolution defects during microfabrication.

19 Claims, No Drawings

RADIATION-SENSITIVE RESIN COMPOSITION

BACKGROUND OF THE INVENTION

1. Field of the Invention

The present invention relates to a radiation-sensitive resin composition and, more particularly, to a radiation-sensitive resin composition suitable as a chemically-amplified resist useful for microfabrication utilizing various types of radiation, for example, deep ultraviolet rays such as a KrF excimer laser or ArF excimer laser, X-rays such as synchrotron radiation, or charged particle rays such as electron beams.

2. Description of the Background Art

In the field of microfabrication represented by fabrication of integrated circuit devices, a lithographic technology enabling microfabrication with a line width of 0.20 μm or less has been demanded in order to achieve higher integration.

A conventional lithographic process utilizes near ultraviolet rays such as i-line as radiation. It is known in the art that microfabrication with a line width of sub-quarter micron is very difficult using near ultraviolet rays.

Therefore, use of radiation with a shorter wavelength has been studied for enabling microfabrication with a line width of 0.20 μm or less. As radiation with a shorter wavelength, deep ultraviolet rays represented by a line spectrum of a mercury lamp and an excimer laser, X-rays, electron beams, and the like can be given. Of these, a KrF excimer laser (wavelength: 248 nm) and an ArF excimer laser (wavelength: 193 nm) have attracted attention.

As a radiation-sensitive resin composition applicable to the excimer laser radiation, a number of compositions utilizing a chemical amplification effect between a component having an acid-dissociable functional group and a component generating an acid (hereinafter called "photoacid generator") which generates an acid upon irradiation (hereinafter called "exposure") has been proposed. Such a composition is hereinafter called a chemically-amplified radiation-sensitive composition.

As the chemically-amplified radiation-sensitive composition, Japanese Patent Publication No. 27660/1990 discloses a composition comprising a polymer containing a t-butyl ester group of carboxylic acid or a t-butylcarbonate group of phenol and a photoacid generator. This composition utilizes the effect of the polymer to release a t-butyl ester group or t-butyl carbonate group by the action of an acid generated upon exposure to form an acidic group such as a carboxylic group or a phenolic hydroxyl group, which renders an exposed area on a resist film readily soluble in an alkaline developer.

Most of conventional chemically-amplified radiation-sensitive compositions use a phenol resin as a base resin. Deep ultraviolet rays used as radiation for exposure are absorbed due to an aromatic ring in the resin and cannot sufficiently reach the lower layers of the resist film. Because of this, the dose of the radiation is greater in the upper layers and is smaller in the lower layers of the resist film. This causes a resist pattern to be thinner in the upper portion and be thicker toward the lower portion, thereby forming a trapezoid shape after development. No sufficient resolution can be obtained from such a resist film. Such a trapezoid shape formed after development cannot give a desired dimensional accuracy in the succeeding steps such as an etching step and an ion implantation step. In addition, if the configuration of the resist pattern is not rectangular on the upper portion, the resist disappears faster during dry etching, making it difficult to control etching conditions.

The shape of the resist pattern can be improved by increasing the radiation transmittance through the resist film. For example, (meth)acrylate resins represented by polymethylmethacrylate are desirable from the viewpoint of radiation transmittance due to the superior transparency to deep ultraviolet rays. Japanese Patent Application Laid-open No. 226461/1992 proposes a chemically-amplified radiation-sensitive resin composition using a methacrylate resin. However, in spite of the excellent micro-processing performance, this composition exhibits only poor dry etching resistance due to the absence of an aromatic ring, giving rise to difficulty in performing etching with high accuracy. This composition thus does not have both radiation transmittance and dry etching resistance at the same time.

A method of introducing an aliphatic ring into the resin component in the composition instead of an aromatic ring has been known as a means for improving dry etching resistance without impairing radiation transmittance of the resist made from a chemically-amplified radiation-sensitive resin composition. A chemically-amplified radiation-sensitive resin composition using a (meth)acrylate resin having an alicyclic ring is proposed in Japanese Patent Application Laid-open No. 234511/1995, for example.

This composition, however, comprises groups which are comparatively easily dissociated with conventional acids (for example, an acetal functional group such as a tetrahydropyranyl group) and groups which are comparatively difficult to be dissociated with acids (for example, a t-butyl functional group such as a t-butyl ester group, t-butylcarbonate group) as an acid-dissociable functional group as the resin component. The resin component possessing the former acid-dissociable functional group exhibits excellent basic characteristics as a resist such as superior sensitivity and excellent pattern shape, but has a problem of poor storage stability. In addition, the resin component possessing the former acid-dissociable functional group exhibits impaired resist characteristics, particularly in terms of sensitivity and pattern shape, in spite of excellent storage stability. In addition, inclusion of an alicyclic structure in the resin components of this composition increases hydrophobicity of the resin, resulting in poor adhesion to substrates.

More recently, several chemically amplified radiation sensitive compositions in which resin components having a lactone ring structure are used have been proposed. For example, Japanese Patent Applications Laid-open No. 239846/1998, No. 274852/1998, No. 12326/1999, and No. 223950/1999 disclose compositions containing a resin component in which the lactone ring structure is bonded at the 2-position (α-position) and a photo acid generator. Japanese Patent Applications Laid-open No. 90637/1997 and No. 319595/1998 disclose compositions containing a resin component in which the lactone ring structure is bonded at the 3-position (β-position) and a photoacid generator. Japanese Patent Application Laid-open No. 207069/1998 discloses compositions containing a resin component in which the lactone ring structure is bonded at the 2 or 3-position and a photoacid generator.

However, most of these chemically amplified radiation sensitive compositions contain a resin component in which the lactone ring structure is bonded mainly at the 2-position, and some compositions at the 3-position. Although the resin components used in conventional chemically amplified radiation sensitive compositions contain a variety of functional groups mentioned above, these compositions have both merits and demerits in the performance as a resist. In addition, as indicated in Japanese Patent Application Laid-open No. 239846/1998, there are no established design standards for an acid-decomposable functional group protecting a carboxyl group, for example.

In view of recent progress in the microfabrication of semiconductor devices, development of a novel resin component exhibiting high transmittance of radiation, having excellent basic properties as a resist, and suitable for use in chemically amplified radiation sensitive compositions which can be adapted to short wavelength radiation represented by a deep ultraviolet rays is an important subject.

Therefore, an object of the present invention is to provide a radiation-sensitive resin composition usable as a chemically amplified positive tone resist, which has high transmittance of radiation, exhibits superior basic properties as a resist such as high sensitivity, resolution, and pattern shape, and is capable of producing semiconductors at a high yield without producing resolution defects during microfabrication.

SUMMARY OF THE INVENTION

This object can be solved in the present invention by a radiation-sensitive resin composition comprising:

(A) an acid-dissociable group-containing resin which is insoluble or scarcely soluble in alkali and becomes alkali soluble when the acid-dissociable group dissociates, the resin comprising a lactone cyclic structure of the following formula (1):

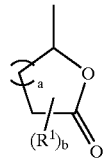

(1)

wherein a is an integer from 1–3, b is an integer from 0–9, and $R^1$ represents a monovalent organic group, and (B) a photoacid generator.

In the above radiation sensitive resin composition, the resin of component (A) preferably comprises a recurring unit of the following formula (2) and at least one other recurring unit having an alicyclic hydrocarbon skeleton in the main chain and/or side chain,

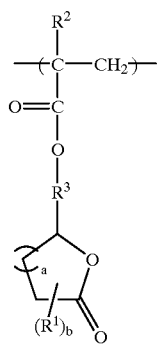

(2)

wherein a is an integer from 1 to 3, b is an integer from 0 to 9, $R^1$ represents a monovalent organic group, $R^2$ represents a hydrogen atom or a methyl group, and $R^3$ represents a linear or branched divalent hydrocarbon group of which the main chain has 1–5 carbon atoms.

In the above radiation sensitive resin composition, the resin of component (A) preferably comprises a recurring unit of the following formula (3) and at least one other recurring unit having an alicyclic hydrocarbon skeleton in the main chain and/or side chain:

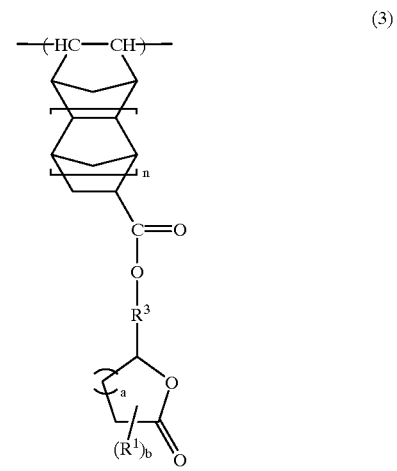

(3)

wherein a is an integer from 1 to 3, b is an integer from 0 to 9, n is an integer from 0 to 2, $R^1$ represents a monovalent organic group, and $R^3$ represents a linear or branched divalent hydrocarbon group of which the main chain has 1–5 carbon atoms.

In the above radiation sensitive resin composition, the at least one other recurring unit is selected from the group consisting of the recurring unit of the following formula (8), the recurring unit of the following formula (9), and the recurring unit of the following formula (10):

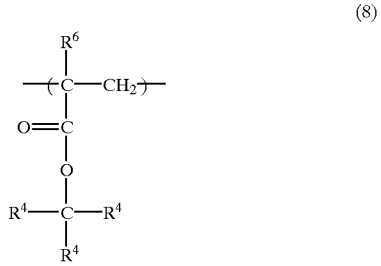

(8)

wherein $R^4$ individually represents a linear or branched alkyl group having 1–4 carbon atoms or a monovalent alicyclic hydrocarbon group having 4–20 carbon atoms or a derivative thereof, or any two of $R^4$s form in combination a divalent alicyclic hydrocarbon group having 4–20 carbon atoms or a derivative thereof, with the remaining $R^4$ being a linear or branched alkyl group having 1–4 carbon atoms or a monovalent alicyclic hydrocarbon group having 4–20 carbon atoms or a derivative thereof, and $R^6$ is a hydrogen atom or a methyl group,

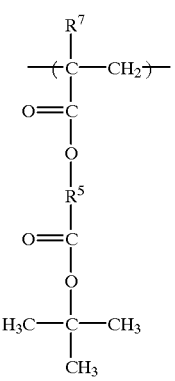

(9)

wherein $R^5$ represents a linear or branched divalent hydrocarbon group having 1–4 main chain carbon atoms or a divalent alicyclic hydrocarbon group having 3–15 carbon atoms, and $R^7$ is a hydrogen atom or a methyl group, and

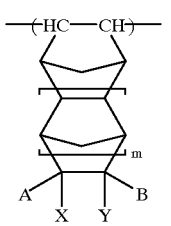

(10)

wherein A and B individually represent a hydrogen atom or an acid-dissociating group having 20 or less carbon atoms which dissociates and produces an acidic functional group in the presence of an acid, at least one of A and B being the acid-dissociating group, X and Y individually represent a hydrogen atom or a linear or branched monovalent alkyl group having 1–4 carbon atoms, and m is an integer of 0 to 2.

Other objects, features and advantages of the invention will hereinafter become more readily apparent from the following description.

DETAILED DESCRIPTION OF THE INVENTION AND PREFERRED EMBODIMENTS

Component (A)

The component (A) of the present invention (hereinafter referred to as "resin (A)", is an acid-dissociable group-containing resin insoluble or scarcely soluble in alkali containing the lactone ring structure of the above formula (1) (hereinafter referred to as "lactone ring structure (1) "). The resin (A) becomes alkali soluble when the acid-dissociable group dissociates.

The following groups are given as examples of the monovalent organic group represented by $R^1$ in the formula (1) linear, branched, or cyclic alkyl groups having 1–6 carbon atoms such as a methyl group, ethyl group, n-propyl group, i-propyl group, n-butyl group, 2-methylpropyl group, 1-methylpropyl group, t-butyl group, n-pentyl group, i-pentyl group, and cyclohexyl group; linear, branched, or cyclic hydroxyalkyl groups having 1–6 carbon atoms such as a hydroxymethyl group, 1-hydroxyethyl group, 2-hydroxyethyl group, 1-hydroxy-n-propyl group, 2-hydroxy-n-propyl group, 3-hydroxy-n-propyl group, 1-hydroxy-n-butyl group, 2-hydroxy-n-butyl group, 3-hydroxy-n-butyl group, 4-hydroxy-n-butyl group, 1-hydroxy-n-pentyl group, 2-hydroxy-n-pentyl group, 3-hydroxy-n-pentyl group, 4-hydroxy-n-pentyl group, 5-hydroxy-n-pentyl group, and 4-hydroxycyclohexyl group; linear, branched, or cyclic alkoxyl groups having 1–6 carbon atoms such as methoxy group, ethoxy group, n-propoxy group, i-propoxy group, n-butoxy group, 2-methylpropoxy group, 1-methylpropoxy group, t-butoxygroup, n-pentyloxy group, and cyclohexyloxy group; a carboxyl group; a cyano group; and linear, branched, or cyclic cyanoalkyl groups having 2–7 carbon atoms such as a cyanomethyl group, 1-cyanoethyl group, 2-cyanoethyl group, 1-cyano-n-propyl group, 2-cyano-n-propyl group, 3-cyano-n-propyl group, 1-cyano-n-butyl group, 2-cyano-n-butyl group, 3-cyano-n-butyl group, 4-cyano-n-butyl group, 1-cyano-n-pentyl group, 2-cyano-n-pentyl group, 3-cyano-n-pentyl group, 4-cyano-n-pentyl group, 5-cyano-n-pentyl group, and 4-cyanocyclohexyl group.

Preferable groups represented by $R^1$ in the formula (1) are a methyl group, methoxy group, n-butoxy group, cyclohexyloxy group, and cyano methyl group, with a methyl group being particularly preferable.

In the formula (1) , 1 is particularly preferable as the integer a, and 0, 1, or 2 is particularly preferable as the integer b.

The lactone ring structure (1) may directly bond to the main chain or side chain of the resin (A) or may bond to the main chain or side chain of the resin (A) through a divalent bonding hand.

As examples of the divalent bonding hand, substituted or unsubstituted, linear, branched, or cyclic hydrocarbon groups having 1–5 main chain carbon atoms, substituted or unsubstituted (poly)oxymethylene groups, substituted or unsubstituted, linear or branched oxyalkylene groups having 2–4 carbon atoms, or derivatives to which two or more such oxyalkylene groups are added, —O—, —CO—, —COO—, —R—OCO—, —R—COO—, —OCO—R—COO—, and —COO—R—OCO— (wherein R is a substituted or unsubstituted, linear or branched divalent hydrocarbon group having 1–4 main chain carbon atoms, hereinafter the same) can be given.

It is preferable that the lactone ring structure (1) of the present invention bonds to the main chain and/or side chain, particularly to the side chain of the resin (A), directly or through a substituted or unsubstituted, linear or branched divalent cyclic hydrocarbon groups having 1–5 main chain carbon atoms or a group —R—OCO—.

As an acid-dissociating group in the resin (A), a group dissociating an acidic functional group in the presence of an acid, particularly an acid-dissociating organic group having 20 or less carbon atoms which produces a carboxyl group (hereinafter referred to simply as "acid-dissociating organic group") can be given.

As preferable specific examples of acid-dissociating organic groups in the present invention, the groups shown by the following formula (4) (hereinafter referred to as "an acid-dissociable group (I)"), the groups shown by the following formula (5) (hereinafter referred to as "an acid-dissociable group (II)"), and the like can be given.

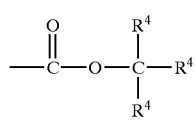
(4)

wherein R⁴ individually represents a linear or branched alkyl group having 1–4 carbon atoms or a monovalent alicyclic hydrocarbon group having 4–20 carbon atoms or a derivative thereof, or any two of R⁴s form in combination a divalent alicyclic hydrocarbon group having 4–20 carbon atoms or a derivative thereof, with the remaining R⁴ being a linear or branched alkyl group having 1–4 carbon atoms or a monovalent alicyclic hydrocarbon group having 4–20 carbon atoms or a derivative thereof.

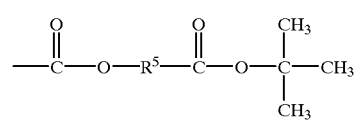
(5)

wherein $R^5$ represents a linear or branched divalent hydrocarbon group having 1–4 main chain carbon atoms or a divalent alicyclic hydrocarbon group having 3–15 carbon atoms.

The acid-dissociating organic group (I) dissociates in the presence of an acid at the bonding site between the carbonyloxy group and the group —C(R⁴)₃. On the other hand, the acid-dissociating organic group (II) dissociates in the presence of an acid at the bonding site between the t-butyl group of the t-butoxycarbonyl group and the oxycarbonyl group.

As examples of the linear or branched alkyl group having 1–4 carbon atoms represented by R⁴ in the formula (4), a methyl group, ethyl group, n-propyl group, i-propyl group, n-butyl group, 2-methylpropyl group, 1-methylpropyl group, and t-butyl group can be given.

Of these, a methyl group and ethyl group are particularly preferable.

As examples of the monovalent alicyclic hydrocarbon group having 4–20 carbon atoms and the divalent alicyclic hydrocarbon group having 4–20 carbon atoms formed by two R⁴s in combination, alicyclic groups derived from a cycloalkane such as norbornane, tricyclodecane, tetracyclododecane, adamantane, cyclobutane, cyclopentane, cyclohexane, cycloheptane, or cyclooctane, and groups obtained by replacing hydrogen atoms on these alicyclic groups with one or more linear or branched alkyl groups having 1–4 carbon atoms, such as methyl group, ethyl group, n-propyl group, i-propyl group, n-butyl group, 2-methyl propyl group, 1-methyl propyl group, or t-butyl group, can be given.

Of these monovalent and divalent alicyclic hydrocarbon groups, groups containing an alicyclic ring derived from norbornane, tricyclodecane, tetracyclododecane, or adamantane, groups in which these alicyclic ring-containing groups are substituted with the above alkyl groups are preferable.

As examples of derivatives of the monovalent or divalent alicyclic hydrocarbon groups, groups having one or more substituents such as a hydroxyl group; a carboxyl group; a linear or branched hydroxyalkyl group having 1–4 carbon atoms such as a hydroxymethyl group, 1-hydroxyethyl group, 2-hydroxyethyl group, 1-hydroxy-n-propyl group, 2-hydroxy-n-propyl group, 3-hydroxy-n-propyl group, 1-hydroxy-n-butyl group, 2-hydroxy-n-butyl group, 3-hydroxy-n-butyl group, and 4-hydroxy-n-butyl group; a linear or branched alkoxyl group having 1–4 carbon atoms such as a methoxy group, ethoxy group, n-propoxy group, i-propoxy group, n-butoxy group, 2-methylpropoxy group, 1-methylpropoxy group, and t-butoxy group; a cyano group; a linear or branched cyanoalkyl group having 2–5 carbon atoms such as a cyanomethyl group, 1-cyanoethyl group, 2-cyanoethyl group, 1-cyanopropyl group, 2-cyanopropyl group, 3-cyanopropyl group, 1-cyanobutyl group, 2-cyanobutyl group, 3-cyanobutyl group, and 4-cyanobutyl group; and the like can be given.

Of these substituents, a hydroxyl group, carboxyl group, hydroxymethyl group, cyano group, cyanomethyl group, and the like are preferable.

As examples of the linear or branched hydrocarbon group having 1–4 carbon atoms in the main chain represented by $R^5$ in the formula (5), methylene group, 1-methyl-1, 1-ethylene group, ethylene group, propylene group, 1,1-dimethylethylene group, trimethylene group, tetramethylene group, and the like can be given.

As examples of the divalent alicyclic hydrocarbon group having 3–15 carbon atoms represented by $R^5$, groups containing an alicyclic ring derived from norbornane, tricyclodecane, tetracyclododecane, adamantane, or cycloalkanes such as cyclopropane, cyclobutane, cyclopentane, cyclohexane, cycloheptane, and cyclooctane; groups in which the above group containing an alicyclic ring is substituted with at least one of linear or branched alkyl groups having 1–4 carbon atoms such as a methyl group, ethyl group, n-propyl group, i-propyl group, n-butyl group, 2-methylpropyl group, 1-methylpropyl group, and t-butyl group; and the like can be given.

Of these alicyclic hydrocarbon groups, groups containing an alicyclic ring derived from norbornane, tricyclodecane, tetracyclododecane, or adamantane, groups in which these alicyclic ring containing groups are substituted with the above alkyl groups, and the like are preferable.

As specific preferable examples of the acid-dissociating organic group (I), t-butoxycarbonyl group and groups shown by the following formulas (I-1) to (I-57) can be given.

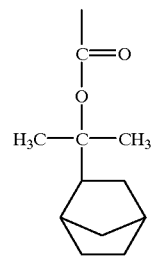
(I-1)

-continued
(I-2)
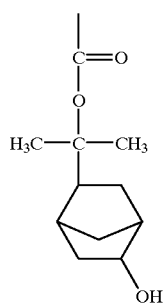
(I-3)
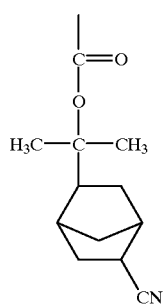
(I-4)
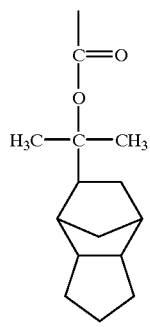
(I-5)
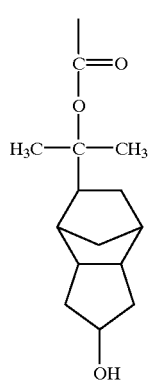
-continued
(I-6)
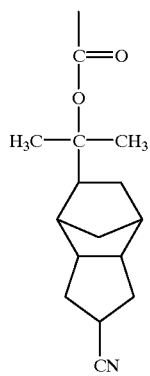
(I-7)
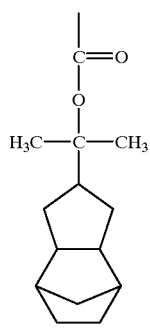
(I-8)
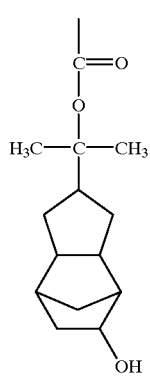
(I-9)
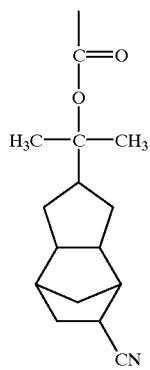

(I-10)
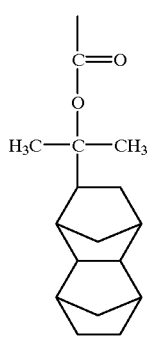
(I-11)
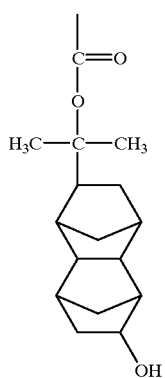
(I-12)
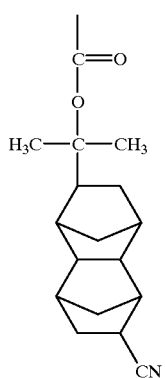
(I-13)
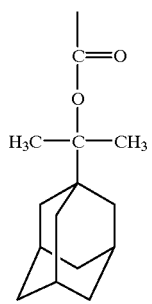
(I-14)
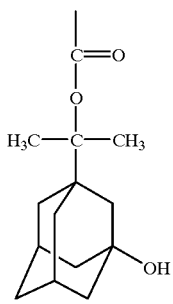
(I-15)
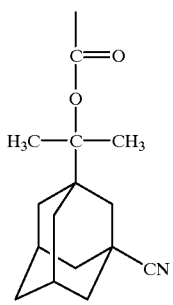
(I-16)
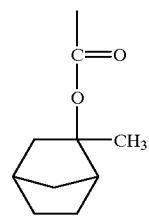
(I-17)
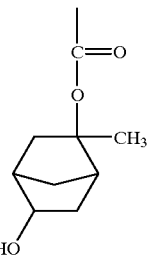
(I-18)
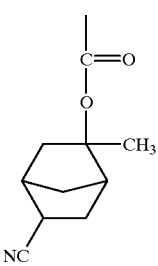

-continued
(I-19)
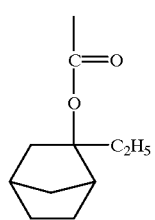
(I-20)
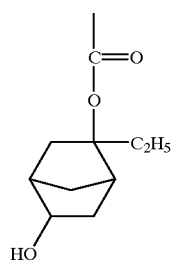
(I-21)
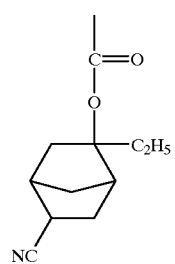
(I-22)
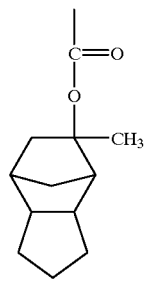
(I-23)
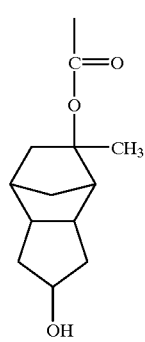
-continued
(I-24)
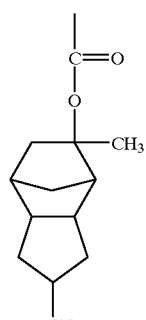
(I-25)
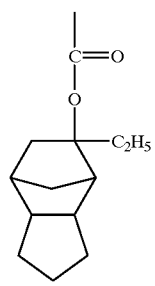
(I-26)
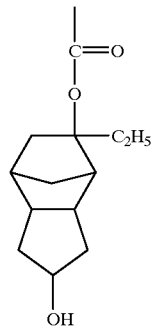
(I-27)
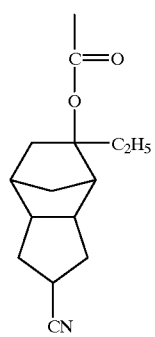
(I-28)
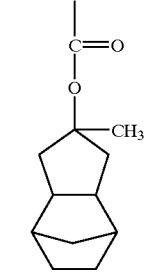

(I-29) 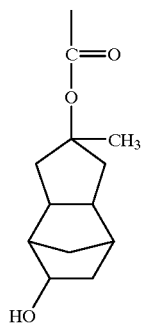
(I-30) 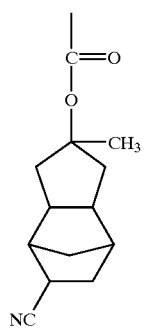
(I-31)
(I-32) 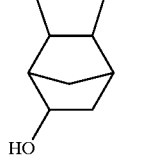
(I-33) 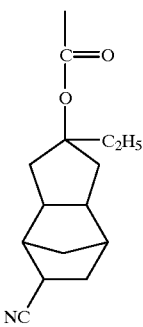
(I-34) 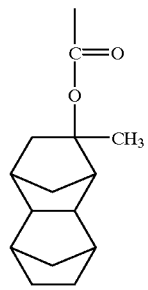
(I-35) 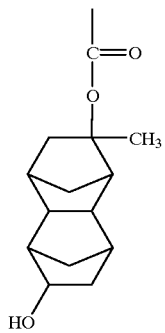
(I-36) 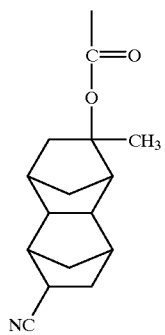
(I-37) 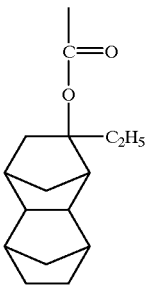

-continued
(I-38)
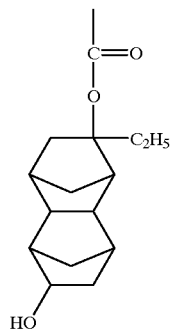
(I-39)
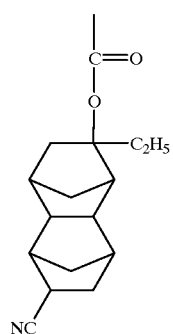
(I-40)
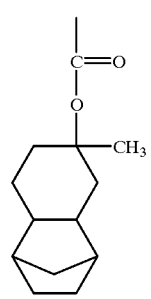
(I-41)
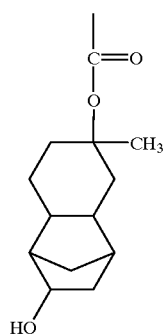
-continued
(I-42)
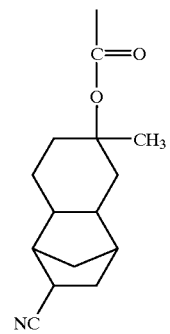
(I-43)
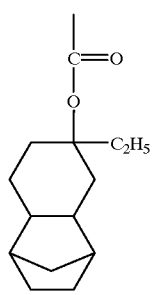
(I-44)
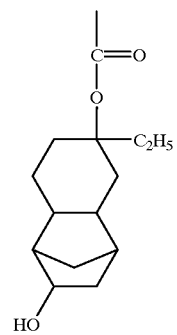
(I-45)
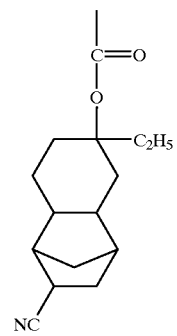

(I-46)
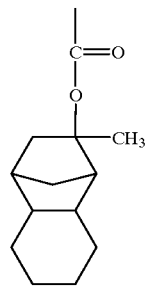
(I-47)
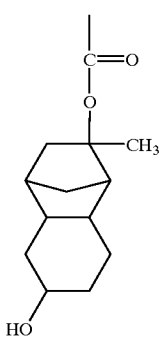
(I-48)
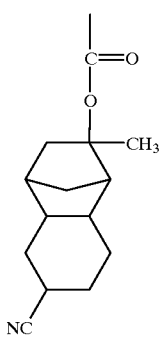
(I-49)
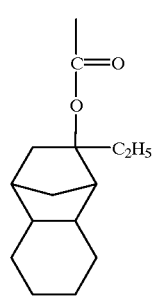
(I-50)
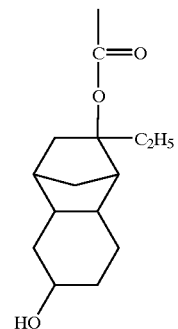
(I-51)
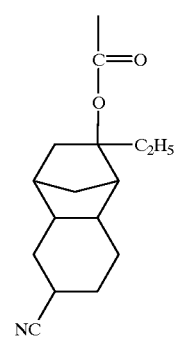
(I-52)
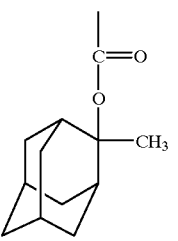
(I-53)
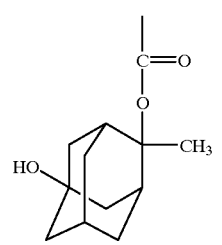
(I-54)
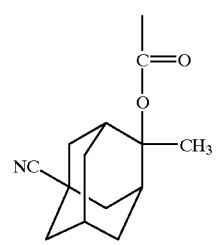

(I-55)

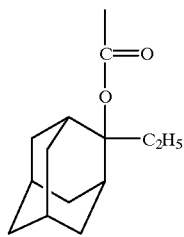

(I-56)

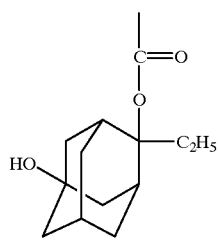

(I-57)

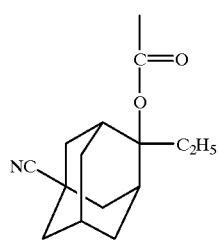

Of these acid-dissociating organic groups (I), t-butoxy carbonyl group and the groups shown by the formulas (I-1), (I-2), (I-10), (I-11), (I-13), (I-14), (I-16), (I-17), (I-22), (I-23), (I-34), (I-35), (I-52), or (I-53) are particularly preferable.

As examples acid-dissociating organic groups other than the acid-dissociating organic group (I) or acid-dissociating organic group (II) (hereinafter referred to as "acid-dissociating organic group (III)"), the following groups can be given: a (cyclo)alkoxycarbonyl group such a methoxycarbonyl group, ethoxycarbonyl group, n-propoxycarbonyl group, i-propoxycarbonyl group, n-butoxycarbonyl group, 2-methylpropoxycarbonyl group, 1-methylpropoxycarbonyl group, n-pentyloxycarbonyl group, n-hexyloxycarbonyl group, n-heptyloxycarbonyl group, n-octyloxycarbonyl group, n-decyloxycarbonyl group, cyclopentyloxycarbonyl group, cyclohexyloxycarbonyl group, 4-t-butylcyclohexyloxycarbonyl group, cycloheptyloxycarbonyl group, and cyclooctyloxycarbonyl group; an aryloxycarbonyl group such as a phenoxycarbonyl group, 4-t-butylphenoxycarbonyl group, and 1-naphthyloxycarbonyl group; an aralkyloxycarbonyl group such as a benzyloxycarbonyl group, 4-t-butylbenzyloxycarbonyl group, phenethyloxycarbonyl group, and 4-t-butylphenethyloxycarbonyl group; a 1-(cyclo)alkyloxyethoxycarbonyl group such as a 1-methoxyethoxycarbonyl group, 1-ethoxyethoxycarbonyl group, 1-n-propoxyethoxycarbonyl group, 1-i-propoxyethoxycarbonyl group, 1-n-butoxyethoxycarbonyl group, 1-(2'-methylpropoxy)ethoxycarbonyl group, 1-(1'-methylpropoxy)ethoxycarbonyl group, 1-t-butoxyethoxycarbonyl group, 1-cyclohexyloxyethoxycarbonyl group, and 1-(4'-t-butylcyclohexyloxy)ethoxycarbonyl group; a 1-aryloxyethoxycarbonyl group such as a 1-phenoxyethoxycarbonyl group, 1-(4'-t-butylphenoxy)ethoxycarbonyl group, and 1-(1'-naphthyloxy)ethoxycarbonyl group; a 1-aralkyloxyethoxycarbonyl group such as a 1-benzyloxyethoxycarbonyl group, 1-(4'-t-butylbenzyloxy)ethoxycarbonyl group, 1-phenethyloxyethoxycarbonyl group, and 1-(4'-t-butylphenethyloxy)ethoxycarbonyl group; a (cyclo)alkoxycarbonylmethoxycarbonyl group such as a methoxycarbonylmethoxycarbonyl group, ethoxycarbonylmethoxycarbonyl group, n-propoxycarbonylmethoxycarbonyl group, i-propoxycarbonylmethoxycarbonyl group, n-butoxycarbonylmethoxycarbonyl group, 2-methylpropoxycarbonylmethoxycarbonyl group, 1-methylpropoxycarbonylmethoxycarbonyl group, cyclohexyloxycarbonylmethoxycarbonyl group, and 4-t-butylcyclohexyloxycarbonylmethoxycarbonyl group; a (cyclo)alkoxycarbonylmethyl group such as a methoxycarbonylmethyl group, ethoxycarbonylmethyl group, n-propoxycarbonylmethyl group, i-propoxycarbonylmethyl group, n-butoxycarbonylmethyl group, 2-methylpropoxycarbonylmethyl group, 1-methylpropoxycarbonylmethyl group, t-butoxycarbonylmethyl group, cyclohexyloxycarbonylmethyl group, and 4-t-butylcyclohexyloxycarbonylmethyl group; an aryloxycarbonylmethyl group such as a phenoxycarbonylmethyl group, 4-t-butylphenoxycarbonylmethyl group, and 1-naphthyloxycarbonylmethyl group; an aralkyloxycarbonylmethyl group such as a benzyloxycarbonylmethyl group, 4-t-butylbenzyloxycarbonylmethyl group, phenethyloxycarbonylmethyl group, and 4-t-butylphenethyloxycarbonylmethyl group; a 2-(cyclo)alkoxycarbonylethyl group such as a 2-methoxycarbonylethyl group, 2-ethoxycarbonylethyl group, 2-n-propoxycarbonylethyl group, 2-i-propoxycarbonylethyl group, 2-n-butoxycarbonylethyl group, 2-(2'-methylpropoxy)carbonylethyl group, 2-(1'-methylpropoxy)carbonylethyl group, 2-t-butoxycarbonylethyl group, 2-cyclohexyloxycarbonylethyl group, and 2-(4'-t-butylcyclohexyloxycarbonyl)ethyl group; a 2-aryloxycarbonylethyl group such as a 2-phenoxycarbonylethyl group, 2-(4'-t-butylphenoxycarbonyl) ethyl group, and 2-(1'-naphthyloxycarbonyl)ethyl group; a 2-aralkyloxycarbonylethyl group such as a 2-benzyloxycarbonylethyl group, 2-(4'-t-butylbenzyloxycarbonyl)ethyl group, 2-phenethyloxycarbonylethyl group, and 2-(4'-t-butylphenethyloxycarbonyl)ethyl group; a tetrahydrofuranyloxycarbonyl group; and a tetrahydropyranyloxycarbonyl group.

Of these acid-dissociable groups (III), groups corresponding to the formula —COOR' (wherein R' represents a linear, branched, or cyclic alkyl group having 1–19 carbon atoms) or the formula —COOCH$_2$COOR" (wherein R" represents a linear, branched, or cyclic alkyl group having 1–17 carbon atoms) are preferable.

The resin (A) is not specifically limited as long as the resin contains the lacton ring structure (1) and acid-dissociating groups such as the acid-dissociating organic group (I), acid-dissociating organic group (II), and acid-dissociating organic group (III), and is insoluble or scarcely soluble in alkali and becomes alkali soluble when the acid-dissociable group dissociates. The resin (A) may be an addition polymerization resin, a polyaddition resin, or a polycondensation resin, but preferably is an addition polymerization resin.

From the viewpoint of transmittance of radioactive rays, the resin (A) of the present invention preferably does not have an aromatic ring or contains as small an amount of aromatic rings as possible.

As a preferable resin (A) of the present invention, an acid-dissociable group-containing resin insoluble or scarcely soluble in alkali containing the recurring unit represented by the following formula (2) (hereinafter referred to as "recurring unit (2)") and/or the recurring unit represented by the following formula (3) (hereinafter referred to as "recurring unit (3)"), and becoming alkali soluble when the acid-dissociable group dissociates, can be given (such a resin (A) being hereinafter referred to as "resin (A1)".

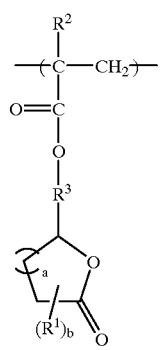

(2)

wherein a is an integer from 1 to 3, b is an integer from 0 to 9, $R^1$ represents a monovalent organic group, W represents a hydrogen atom or a methyl group, and $R^3$ represents a linear or branched divalent hydrocarbon group of which the main chain has 1–5 carbon atoms,

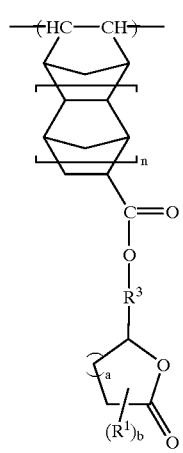

(3)

wherein a is an integer from 1 to 3, b is an integer from 0 to 9, n is an integer from 0 to 2, $R^1$ represents a monovalent organic group, and $R^3$ represents a linear or branched divalent hydrocarbon group of which the main chain has 1–5 carbon atoms.

As examples of the linear or branched hydrocarbon group having 1–5 carbon atoms represented by $R^3$ in the formulas (2) and (3), methylene group, 1-methyl-1,1-ethylene group, ethylene group, propylene group, 1,1-dimethylethylene group, trimethylene group, tetramethylene group, hydroxymethylene group, 1-hydroxy-1,1-ethylene group, 1-hydroxy-1,2-ethylene group, 2-hydroxy-1,2-ethylene group, 1-hydroxytrimethylene group, 2-hydroxytrimethylene group, 3-hydroxytrimethylene group, and the like can be given.

Of these divalent hydrocarbon groups or the derivatives, a methylene group, ethylene group, and 2-hydroxytrimethylene group are particularly preferable.

In the formulas (2) and (3), 1 is particularly preferable as the integer a, and 0, 1, or 2 is particularly preferable as the integer b.

Either one or two or more recurring units (2) and the recurring units (3) maybe present in the resin (A1). The group represented by $R^1$ in the recurring unit (2) and the group represented by $R^1$ in the recurring unit (3) may be either the same or different. In addition, the group represented by $R^3$ in the recurring unit (2) and the group represented by $R^3$ in the recurring unit (3) may be either the same or different.

The polymerizable unsaturated monomers produces the recurring unit (2) are compounds represented by the following formula (6) (hereinafter referred to as "(meth)acrylic acid derivatives (α)").

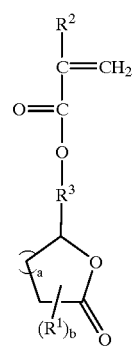

(6)

wherein a, b, $R^2$, $R^2$, and $R^3$ are respectively the same as those defined in the above formula (2).

As examples of polymerizable unsaturated monomers which provide the recurring unit (3), compounds shown by the following formula (7) (hereinafter referred to as "norbornene derivatives ((α)") can be given.

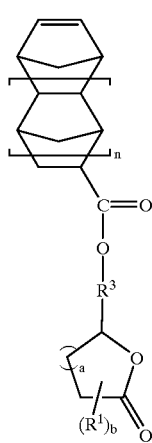

(7)

wherein a, b, n, $R^1$, and $R^3$ are respectively the same as those defined in the above formula (3).

The compounds shown by the following formulas (6-1) to (6-28) can be given as preferable examples of the (meth) acrylic acid derivatives (α).
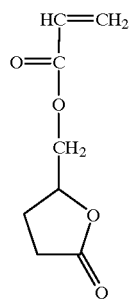
(6-1)
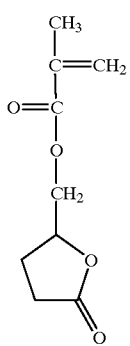
(6-2)
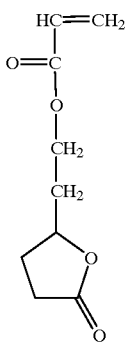
(6-3)
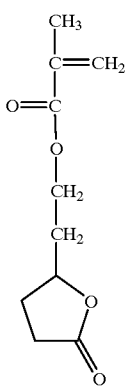
(6-4)
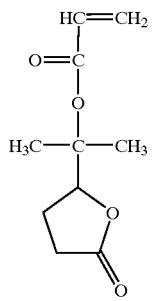
(6-5)
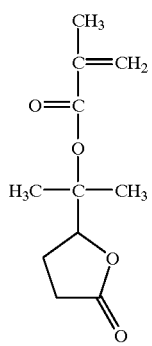
(6-6)
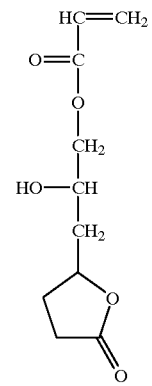
(6-7)
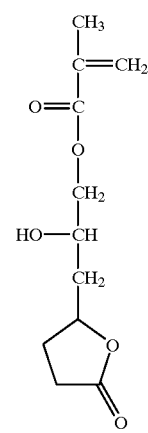
(6-8)

(6-9) 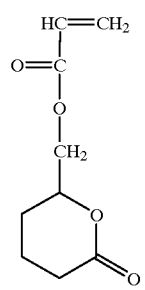
(6-10) 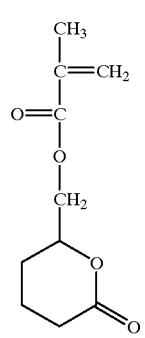
(6-11) 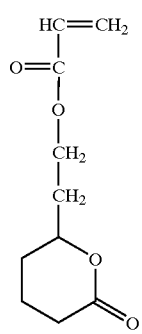
(6-12) 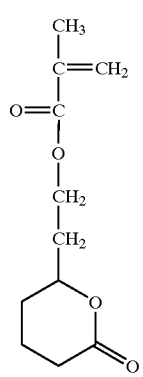
(6-13) 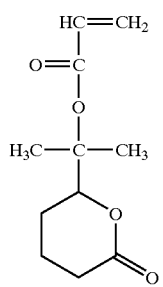
(6-14) 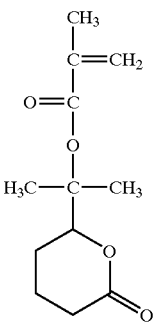
(6-15) 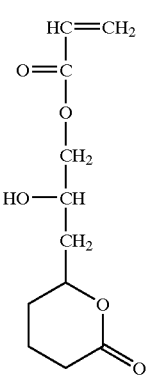
(6-16) 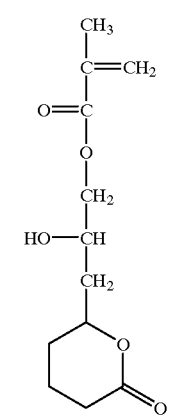
(6-17) 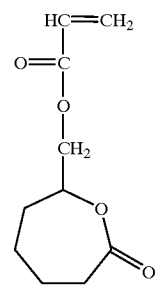

(6-18) 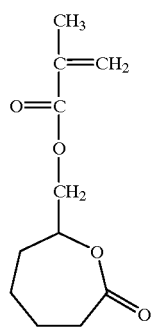
(6-19) 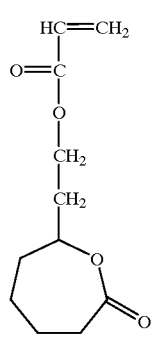
(6-20) 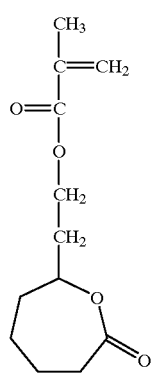
(6-21) 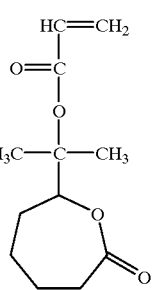
(6-22) 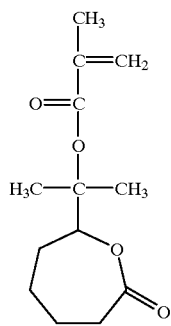
(6-23) 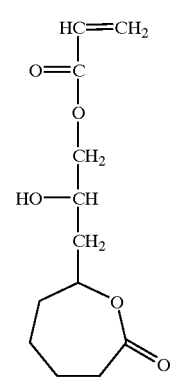
(6-24) 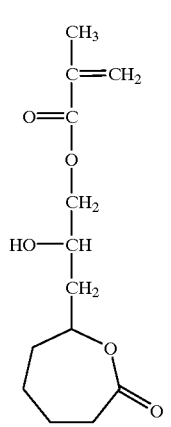
(6-25) 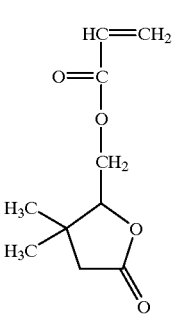

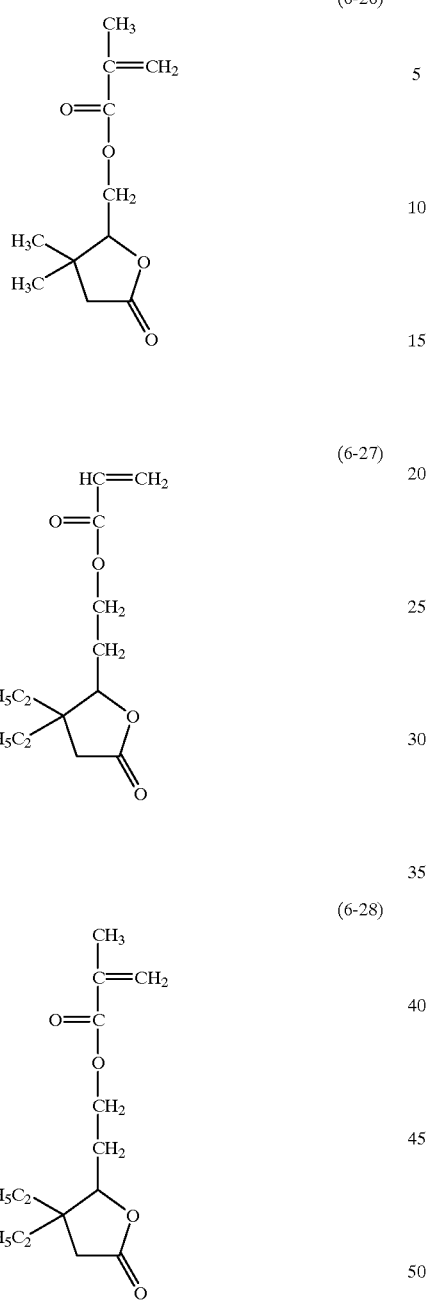

(6-26)

(6-27)

(6-28)

Of these (meth) acrylic acid derivatives (α), compounds shown by the formulas (6-1), (6-2), (6-25), and (6-26) are preferable.

The (meth)acrylic acid derivatives (α) can be synthesized by the esterification reaction of 4-hydroxymethyl-γ-butyrolactone and (meth) acrylic acid chloride, for example.

The compounds shown by the following formulas (7-1) to (7-28) can be given as preferable examples of the norbornene derivatives (α).

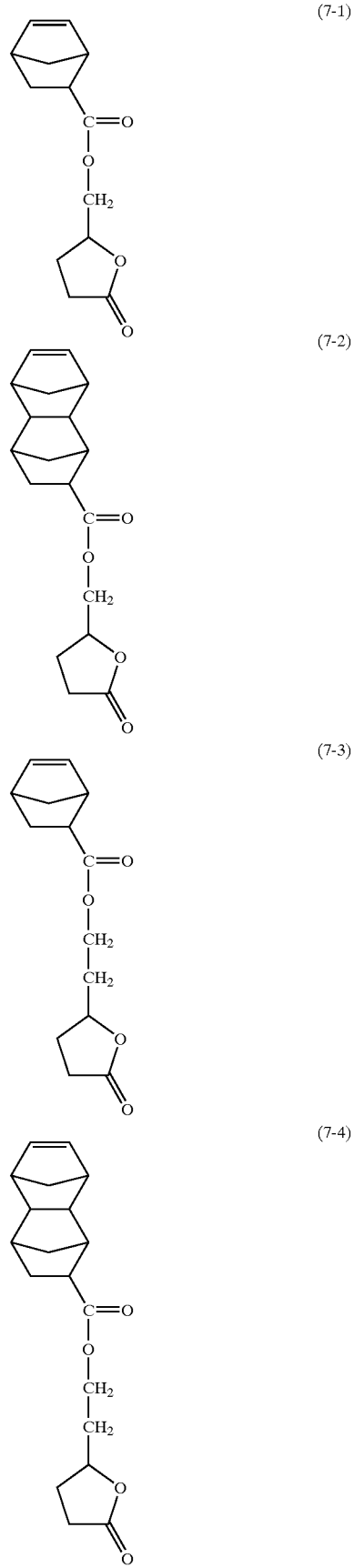

(7-1)

(7-2)

(7-3)

(7-4)

(7-5)
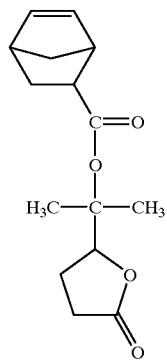
(7-6)
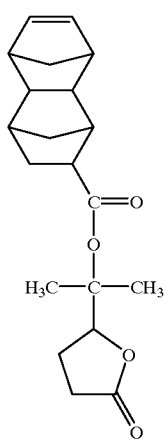
(7-7)
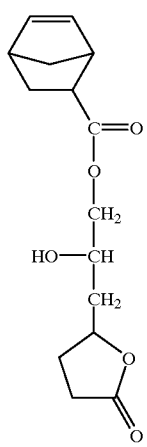
(7-8)
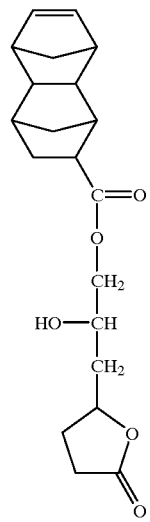
(7-9)
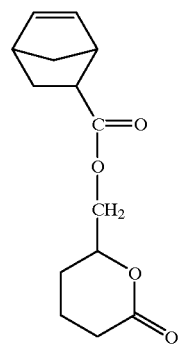
(7-10)
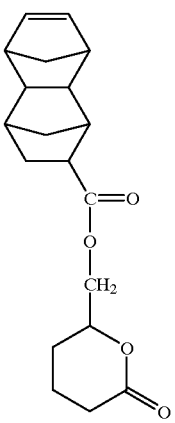

(7-11)
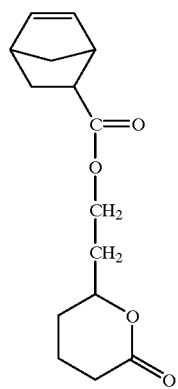
(7-12)
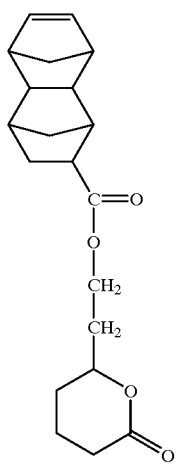
(7-13)
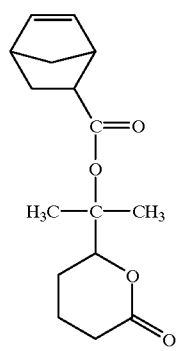
(7-14)
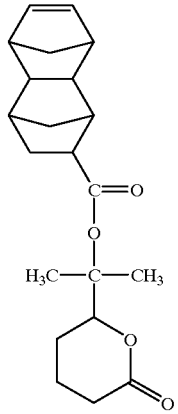
(7-15)
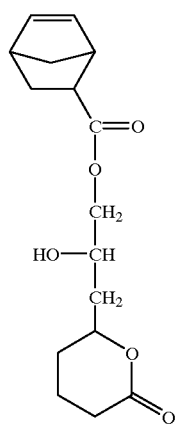
(7-16)
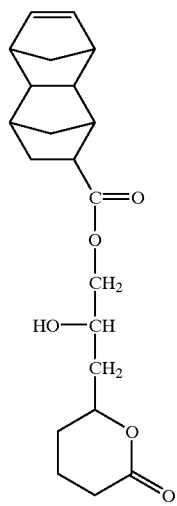

-continued
(7-17)
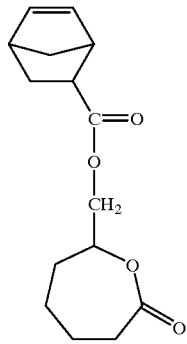
(7-18)
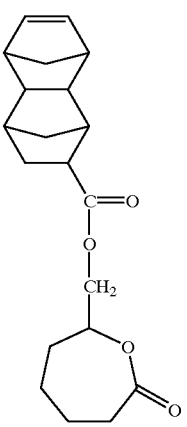
(7-19)
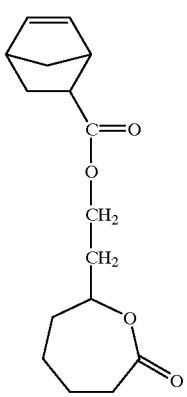
-continued
(7-20)
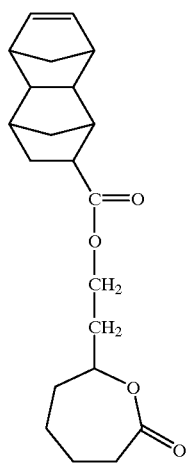
(7-21)
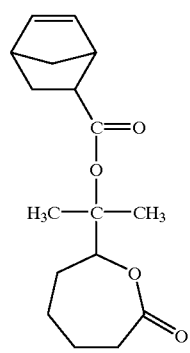
(7-22)
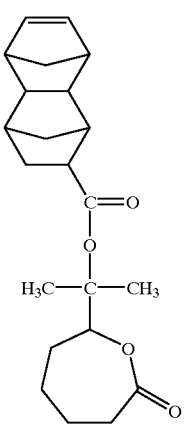

(7-23)
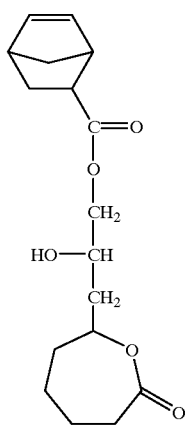

(7-24)
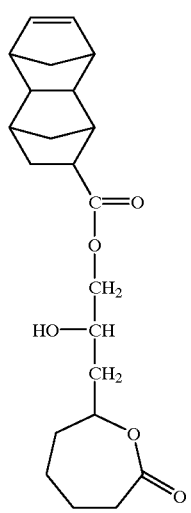

(7-25)
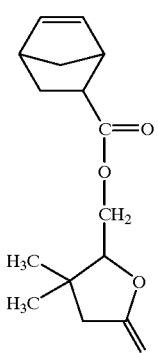

(7-26)
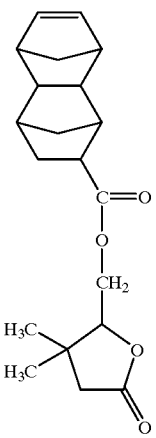

(7-27)
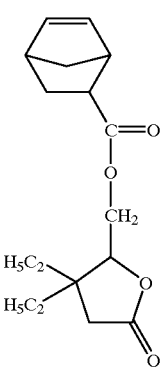

(7-28)
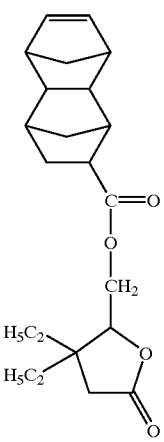

The norbornene derivatives (α) can be synthesized by the Diels-Alder reaction of the above (meth)acrylic acid derivatives (α) and cyclopentadiene or the like, for example.

In addition to the recurring unit (1) and/or the recurring unit (2), the resin (A1) usually comprises one or more other recurring units.

As preferable examples of such other recurring units, the units shown by the following formula (8) (hereinafter referred to as "recurring unit (8)"), the following formula (9) (hereinafter referred to as "recurring unit (9)"), and the following formula (10) (hereinafter referred to as "recurring unit (10)") can be given.

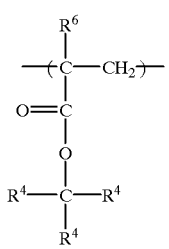

(8)

wherein R⁴ is the same as R⁴ in the formula (4) and R⁶ represents a hydrogen atom or a methyl group;

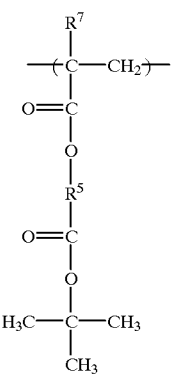

(9)

wherein R⁵ is the same as R⁵ in the formula (5) and R⁷ represents a hydrogen atom or a methyl group;

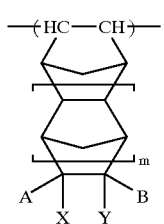

(10)

wherein A and B individually represent a hydrogen atom or an acid-dissociating group having 20 or less carbon atoms which dissociates and produces an acidic functional group in the presence of an acid, at least one of A and B being the acid-dissociating group, X and Y individually represent a hydrogen atom or a linear or branched monovalent alkyl group having 1–4 carbon atoms, and m is an integer from 0 to 2.

The polymerizable unsaturated monomer providing the recurring unit (8) is a compound derived from (meth) acrylic acid by converting the carboxyl group into an acid-dissociating organic group (I) (hereinafter referred to as "(meth)acrylic acid derivative (β-1)"). The polymerizable unsaturated monomer providing the recurring unit (9) is a compound derived from (meth) acrylic acid by converting the carboxyl group into an acid-dissociating organic group (II) (hereinafter referred to as "(meth)acrylic acid derivative (β-2)").

As the acid-dissociable groups A and B in the formula (10), t-butoxycarbonyl group and t-butoxycarbonylmethoxycarbonyl group, as well as the groups corresponding to —COOR' (wherein R' represents a linear, branched, or cyclic alkyl group having 1–19 carbon atoms) or —COOCH₂COOR" (wherein R" represents a linear, branched, or cyclic alkyl group having 1–17 carbon atoms) among the acid-dissociating organic groups (III), are preferable. Particularly preferable groups are t-butoxycarbonyl group, t-butoxycarbonylmethoxycarbonyl group, and 1-methylpropoxycarbonyl group.

As examples of linear or branched alkyl groups having 1–4 carbon atoms represented by X or Y, a methyl group, ethyl group, n-propyl group, i-propyl group, n-butyl group, 2-methylpropyl group, 1-methylpropyl group, t-butyl group, and the like can be given.

Of these alkyl groups, a methyl group and ethyl group are particularly preferable.

m in the formula (10) is preferably either 0 or 1.

As examples of polymerizable unsaturated monomers providing the recurring unit (10), compounds shown by the following formula (11) (hereinafter referred to as "norbornene derivatives (β-1)") can be given.

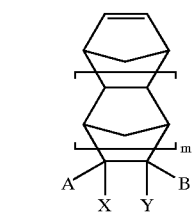

(11)

wherein A, B, X, Y, and m have the same meanings as defined for the formula (10).

The following compounds can be given as examples of the norbornene derivatives (β-1) having m=0 in the formula (11):

5-methoxycarbonylnorbornene,
5-ethoxycarbonylnorbornene,
5-n-propoxycarbonylnorbornene,
5-i-propoxycarbonylnorbornene,
5-n-butoxycarbonylnorbornene,
5-(2'-methylpropoxy)carbonylnorbornene,
5-(1'-methylpropoxy)carbonylnorbornene,
5-t-butoxycarbonylnorbornene,
5-cyclohexyloxycarbonylnorbornene,
5-(4'-t-butylcyclohexyloxy)carbonylnorbornene,
5-phenoxycarbonylnorbornene,
5-(1'-ethoxyethoxy)carbonylnorbornene,
5-(1'-cyclohexyloxyethoxy)carbonylnorbornene,
5-t-butoxycarbonylmethoxycarbonylnorbornene,
5-tetrahydrofuranyloxycarbonylnorbornene,
5-tetrahydropyranyloxycarbonylnorbornene,
5-methyl-5-methoxycarbonylnorbornene,
5-methyl-5-ethoxycarbonylnorbornene,
5-methyl-5-n-propoxycarbonylnorbornene,
5-methyl-5-i-propoxycarbonylnorbornene,
5-methyl-5-n-butoxycarbonylnorbornene,
5-methyl--(2'-methylpropoxy)carbonylnorbornene,
5-methyl-5-(1'-methylpropoxy)carbonylnorbornene,
5-methyl-5-t-butoxycarbonylnorbornene,
5-methyl-5-cyclohexyloxycarbonylnorbornene,
5-methyl-5-(4'-t-butylcyclohexyloxy)carbonylnorbornene,
5-methyl-5-phenoxycarbonylnorbornene,
5-methyl-5-(1'-ethoxyethoxy)carbonylnorbornene,
5-methyl-5-(1'-cyclohexyloxyethoxy)carbonylnorbornene,
5-methyl-5-t-butoxycarbonylmethoxycarbonylnorbornene,
5-methyl-5-tetrahydrofuranyloxycarbonylnorbornene,
5-methyl-5-tetrahydropyranyloxycarbonylnorbornene, 5,6-di(methoxycarbonyl)norbornene,
5,6-di(ethoxycarbonyl)norbornene,
5,6-di(n-propoxycarbonyl)norbornene,
5,6-di(i-propoxycarbonyl)norbornene,
5,6-di(n-butoxycarbonyl)norbornene,
5,6-di(2'-methylpropoxycarbonyl)norbornene,
5,6-di(1'-methylpropoxycarbonyl)norbornene,
5,6-di(t-butoxycarbonyl)norbornene,
5,6-di(cyclohexyloxycarbonyl)norbornene,
5,6-di(4'-t-butylcyclohexyloxycarbonyl)norbornene,
5,6-di(phenoxycarbonyl)norbornene,
5,6-di(1'-ethoxyethoxycarbonyl)norbornene,
5,6-di(1'-cyclohexyloxyethoxycarbonyl)norbornene,
5,6-di(t-butoxycarbonylmethoxycarbonyl)norbornene,
5,6-di(tetrahydrofuranyloxycarbonyl)norbornene, and
5,6-di(tetrahydropyranyloxycarbonyl)norbornene.

The following compounds can be given as examples of the norbornene derivatives (β-1) having m=1 in the formula (11):

8-methoxycarbonyltetracyclo[4.4.0.1$^{2,5}$.1$^{7,10}$]dodeca-3-ene,
8-ethoxycarbonyltetracyclo[4.4.0.1$^{2,5}$.1$^{7,10}$]dodeca-3-ene,
8-n-propoxycarbonyltetracyclo[4.4.0.1$^{2,5}$.1$^{7,10}$]dodeca-3-ene,
8-i-propoxycarbonyltetracyclo[4.4.0.1$^{2,5}$.1$^{7,10}$]dodeca-3-ene,
8-n-butoxycarbonyltetracyclo[4.4.0.1$^{2,5}$.1$^{7,10}$]dodeca-3-ene,
8-(2'-methylpropoxy)carbonyltetracyclo[4.4.0.1$^{2,5}$.1$^{7,10}$]dodeca-3-ene,
8-(1'-methylpropoxy)carbonyltetracyclo[4.4.0.1$^{2,5}$.1$^{7,10}$]dodeca-3-ene,
8-t-butoxycarbonyltetracyclo[4.4.0.1$^{2,5}$.1$^{7,10}$]dodeca-3-ene,
8-cyclohexyloxycarbonyltetracyclo[4.4.0.1$^{2,5}$.1$^{7,10}$]dodeca-3-ene,
8-(4'-t-butylcyclohexyloxy)carbonyltetracyclo-[4.4.0.1$^{2,5}$.1$^{7,10}$]dodeca-3-ene,
8-phenoxycarbonyltetracyclo[4.4.0.1$^{2,5}$.1$^{7,10}$]dodeca-3-ene,
8-(1'-ethoxyethoxy)carbonyltetracyclo[4.4.0.1$^{2,5}$.1$^{7,10}$]dodeca-3-ene,
8-(1'-cyclohexyloxyethoxy)carbonyltetracyclo-[4.4.0.1$^{2,5}$.1$^{7,10}$]dodeca-3-ene,
8-t-butoxycarbonylmethoxycarbonyltetracyclo[4.4.0.1$^{2,5}$.1$^{7,10}$]dodeca-3-ene,
8-tetrahydrofuranyloxycarbonyltetracyclo[4.4.0.1$^{2,5}$.1$^{7,10}$]dodeca-3-ene,
8-tetrahydropyranyloxycarbonyltetracyclo[4.4.0.1$^{2,5}$.1$^{7,10}$]dodeca-3-ene,
8-methyl-8-methoxycarbonyltetracyclo[4.4.0.1$^{2,5}$.1$^{7,10}$]dodeca-3-ene,
8-methyl-8-ethoxycarbonyltetracyclo[4.4.0.1$^{2,5}$.1$^{7,10}$]dodeca-3-ene,
8-methyl-8-n-propoxycarbonyltetracyclo[4.4.0.1$^{2,5}$.1$^{7,10}$]dodeca-3-ene,
8-methyl-8-i-propoxycarbonyltetracyclo[4.4.0.1$^{2,5}$.1$^{7,10}$]dodeca-3-ene,
8-methyl-8-n-butoxycarbonyltetracyclo[4.4.0.1$^{2,5}$.1$^{7,10}$]dodeca-3-ene,
8-methyl-8-(2'-methylpropoxy)carbonyltetracyclo[4.4.0.1$^{2,5}$.1$^{7,10}$]dodeca3-ene,
8-methyl-8-(1'-methylpropoxy)[4.4.0.1$^{2,5}$.1$^{7,10}$]dodeca-3-ene,
8-methyl-8-t-butoxycarbonyltetracyclo[4.4.0.1$^{2,5}$.1$^{7,10}$]dodeca-3-ene,
8-methyl-8-cyclohexyloxycarbonyltetracyclo[4.4.0.1$^{2,5}$.1$^{7,10}$]dodeca-3-ene,
8-methyl-8-(4'-t-butylcyclohexyloxy)carbonyltetracyclo[4.4.0.1$^{2,5}$.1$^{7,10}$]dodeca-3-ene,
8-methyl-8-phenoxycarbonyltetracyclo[4.4.0.1$^{2,5}$.1$^{7,10}$]dodeca-3-ene,
8-methyl-8-(1'-ethoxyethoxy)carbonyltetracyclo[4.4.0.1$^{2,5}$.1$^{7,10}$]dodeca-3-ene,
8-methyl-8-(1'-cyclohexyloxyethoxy)carbonyltetracyclo[4.4.0.1$^{2,5}$.1$^{7,10}$]dodeca-3-ene,
8-methyl-8-t-butoxycarbonylmethoxycarbonyltetracyclo[4.4.0.1$^{2,5}$.1$^{7,10}$]dodeca-3-ene,
8-methyl-8-tetrahydrofuranyloxycarbonyltetracyclo[4.4.0.1$^{2,5}$.1$^{7,10}$]dodeca-3-ene,
8-methyl-8-tetrahydropyranyloxycarbonyltetracyclo[4.4.0.1$^{2,5}$.1$^{7,10}$]dodeca-3-ene,
8,9-di(methoxycarbonyl)tetracyclo[4.4.0.1$^{2,5}$.1$^{7,10}$]dodeca-3-ene,
8,9-di(ethoxycarbonyl)tetracyclo[4.4.0.1$^{2,5}$.1$^{7,10}$]dodeca-3-ene,
8,9-di(n-propoxycarbonyl)tetracyclo[4.4.0.1$^{2,5}$.1$^{7,10}$]dodeca-3-ene,
8,9-di(i-propoxycarbonyl)tetracyclo[4.4.0.1$^{2,5}$.1$^{7,10}$]dodeca-3-ene,
8,9-di(n-butoxycarbonyl)tetracyclo[4.4.0.1$^{2,5}$.1$^{7,10}$]dodeca-3-ene,
8,9-di(2'-methylpropoxycarbonyl)tetracyclo[4.4.0.1$^{2,5}$.1$^{7,10}$]dodeca-3-ene,
8,9-di(1'-methylpropoxycarbonyl)tetracyclo[4.4.0.1$^{2,5}$.1$^{7,10}$]dodeca-3-ene,
8,9-di(t-butoxycarbonyl)tetracyclo[4.4.0.1$^{2,5}$.1$^{7,10}$]dodeca-3-ene,
8,9-di(cyclohexyloxycarbonyl)tetracyclo[4.4.0.1$^{2,5}$.1$^{7,10}$]dodeca-3-ene,
8,9-di(41-t-butylcyclohexyloxycarbonyl)tetracyclo[4.4.0.1$^{2,5}$.1$^{7,10}$]dodeca-3-ene,
8,9-di(phenoxycarbonyl)tetracyclo[4.4.0.1$^{2,5}$.1$^{7,10}$]dodeca-3-ene,
8,9-di(1'-ethoxyethoxycarbonyl)tetracyclo[4.4.0.1$^{2,5}$.1$^{7,10}$]dodeca-3-ene,
8,9-di(1'-cyclohexyloxyethoxycarbonyl)tetracyclo[4.4 0.1$^{2,5}$.1$^{7,10}$]dodeca-3-ene,
8,9-di(t-butoxycarbonylmethoxycarbonyl)tetracyclo[4.4.0.1$^{2,5}$.1$^{7,10}$]dodeca-3-ene,
8,9-di(tetrahydrofuranyloxycarbonyl)tetracyclo[4.4.0.1$^{2,5}$.1$^{7,10}$]dodeca-3-ene, and
8,9-di(tetrahydropyranyloxycarbonyl)tetracyclo[4.4.0.1$^{2,5}$.1$^{7,10}$]dodeca-3-ene.

Of these norbornene derivativeses (β-1), 5-t-butoxycarbonylnorbornene, 5,6-di(t-butoxycarbonyl) norbornene, 5,6-di(t-butoxycarbonylmethoxycarbonyl) norbornene, 8-t-butoxycarbonyltetracyclo[4.4.0.1$^{2,5}$.1$^{7,10}$] dodeca-3-ene, 8-methyl-8-t-butoxycarbonyl)tetracyclo [4.4.0.1$^{2,5}$.1$^{7,10}$]dodeca-3-ene, 8-methyl-8-t-butoxycarbonylmethoxycarbonyl)tetracyclo[4.4.0.1$^{2,5}$.1$^{7,10}$]dodeca-3-ene, and the like are preferable.

The resin (A1) may comprise at least one recurring unit other than the recurring units (8), (9), and (10) (hereinafter referred to as "other recurring units").

The following compounds can be given as examples of mono-functional monomers among the polymerizable unsaturated monomers which provide the other recurring units: (meth)acrylatic acid esters having an alicyclic hydrocarbon skeleton such as norbornyl (meth)acrylate, isobornyl (meth) acrylate, tricyclodecanyl (meth)acrylate, tetracyclodecanyl (meth)acrylate, dicyclopentenyl (meth)acrylate, adamantyl (meth)acrylate, adamantylmethyl (meth)acrylate, 1-methyladamantyl (meth)acrylate, cyclopropyl (meth)

acrylate, cyclopentyl (meth)acrylate, cyclohexyl (meth)acrylate, cyclohexenyl (meth)acrylate, 4-methoxycyclohexyl (meth)acrylate, 2-cyclopropyloxycarbonylethyl (meth)acrylate, 2-cyclopentyloxycarbonylethyl (meth)acrylate, 2-cyclohexyloxycarbonylethyl (meth)acrylate, 2-cyclohexenyloxycarbonylethyl (meth)acrylate, and 2-(4'-methoxycyclohexyl)oxycarbonylethyl (meth)acrylate; (meth)acrylatic acid esters having a carboxyl group-containing alicyclic hydrocarbon skeleton such as 4-carboxycyclohexyl (meth)acrylate, carboxytricyclodecanyl (meth)acrylate, and carboxytetracyclodecanyl (meth)acrylate; compounds which can introduce an alicyclic hydrocarbon skeleton in the main chain of the resin (A1) such as norbornene (e.g. bicyclo[2.2.1]hept-2-ene), 5-methylnorbornene, 5-ethylnorbornene, 5-hydroxynorbornene. 5-hydroxymethylnorbornene, tetracyclo[4.4.0.1$^{2,5}$.1$^{7,10}$]dodeca-3-ene, 8-methyltetracyclo[4.4.0.1$^{2,5}$.1$^{7,10}$]dodeca-3-ene, 8-ethyltetracyclo[4.4.0.1$^{2,5}$.1$^{7,10}$]dodeca-3-ene, 8-hydroxytetracyclo[4.4.0.1$^{2,5}$.1$^{7,10}$]dodeca-3-ene, 8-hydroxymethyltetracyclo[4.4.0.1$^{2,5}$.1$^{7,10}$]dodeca-3-ene, 8-fluorotetracyclo[4.4.0.1$^{2,5}$.1$^{7,10}$]dodeca-3-ene, 8-fluoromethyltetracyclo[4.4.0.1$^{2,5}$.1$^{7,10}$]dodeca-3-ene, 8-difluoromethyltetracyclo[4.4.0.1$^{2,5}$.1$^{7,10}$]dodeca-3-ene, 8-trifluoromethyltetracyclo[4.4.0.1$^{2,5}$.1$^{7,10}$]dodeca-3-ene, 8-pentafluoroethyltetracyclo[4.4.0.1$^{2,5}$.1$^{7,10}$]dodeca-3-ene, 8,8-difluorotetracyclo[4.4.0.1$^{2,5}$.1$^{7,10}$]dodeca-3-ene, 8,9-difluorotetracyclo[4.4.0.1$^{2,5}$.1$^{7,10}$]dodeca-3-ene 8,8-bis(trifluoromethyl)tetracyclo[4.4.0.1$^{2,5}$.1$^{7,10}$]dodeca-3-ene, 8,9-bis(trifluoromethyl)tetracyclo[4.4.0.1$^{2,5}$.1$^{7,10}$]dodeca-3-ene, 8-methyl-8-trifluoromethyltetracyclo[4.4.0.1$^{2,5}$.1$^{7,10}$]dodeca-3-ene, 8,8,9-trifluorotetracyclo[4.4.0.1$^{2,5}$.1$^{7,10}$]dodeca-3-ene, 8,8,9-tris(trifluoromethyl)tetracyclo[4.4.0.1$^{2,5}$.1$^{7,10}$]dodeca-3-ene, 8,8,9,9-tetrafluorotetracyclo[4.4.0.1$^{2,5}$.1$^{7,10}$]dodeca-3-ene, 8,8,9,9-tetrakis(trifluoromethyl)tetracyclo[4.4.0.1$^{2,5}$.1$^{7,10}$]dodeca-3-ene, 8,8-difluoro-9,9-bis(trifluoromethyl)tetracyclo[4.4.0.1$^{2,5}$.1$^{7,10}$]dodeca-3-ene, 8,9-difluoro-8,9-bis(trifluoromethyl)tetracyclo[4.4.0.1$^{2,5}$.1$^{7,10}$]dodeca-3-ene, 8,8,9-trifluoro-9-trifluoromethyltetracyclo[4.4.0.1$^{2,5}$.1$^{7,10}$]dodeca-3-ene, 8,8,9-trifluoro-9-trifluoromethoxytetracyclo[4.4.0.1$^{2,5}$.1$^{7,10}$]dodeca-3-ene, 8,8,9-trifluoro-9-pentafluoropropoxytetracyclo[4.4.0.1$^{2,5}$.1$^{7,10}$]dodeca-3-ene, 8-fluoro-8-pentafluoroethyl-9,9-bis(trifluoromethyl)tetracyclo[4.4.0.1$^{2,5}$.1$^{7,10}$]dodeca-3-ene, 8,9-difluoro-8-heptafluoroisopropyl-9-trifluoromethyltetracyclo[4.4.0.1$^{2,5}$.1$^{7,10}$]dodeca-3-ene, 8-chloro-8,9,9-trifluorotetracyclo[4.4.0.1$^{2,5}$.1$^{7,10}$]dodeca-3-ene, 8,9-dichloro-8,9-bis(trifluoromethyl)tetracyclo[4.4.0.1$^{2,5}$.1$^{7,10}$]dodeca-3-ene, 8-(2',2',2'-trifluorocarboethoxy)tetracyclo[4.4.0.1$^{2,5}$.1$^{7,10}$]dodeca-3-ene, 8-methyl-8-(2',2',2'-trifluorocarboethoxy)tetracyclo[4.4.0.1$^{2,5}$.1$^{7,10}$]dodeca-3-ene, tricyclo[5.2.1.0$^{2,6}$]deca-8-ene, tricyclo[5.2.1.0$^{2,6}$]deca-3-ene, tricyclo[4.4.0.1$^{2,5}$]undeca-3-ene, tricyclo[6.2.1.0$^{1,8}$]undeca-9-ene, tricyclo[6.2.1.0$^{1,8}$]undeca-4-ene, tetracyclo[4.4.0.1$^{2,5}$.1$^{7,10}$.0$^{1,6}$]dodeca-3-ene, 8-methyltetracyclo[4.4.0.1$^{2,5}$.1$^{7,10}$.0$^{1,6}$]dodeca-3-ene, 8-ethylidenetetracyclo[4.4.0.1$^{2,5}$.1$^{7,12}$]dodeca-3-ene, 8-ethylidenetetracyclo[4.4.0.1$^{2,5}$.1$^{7,10}$.0$^{1,6}$]dodeca-3-ene, pentacyclo[6.5.1.1$^{3,6}$.0$^{2,7}$.0$^{9,13}$]pentadeca-4-ene, pentacyclo[7.4.0.1$^{2,5}$.1$^{9,12}$.0$^{8,13}$]pentadeca-3-ene, (meth) acrylic acid esters such as methyl (meth) acrylate, ethyl (meth)acrylate, n-propyl (meth)acrylate, n-butyl (meth)acrylate, 2-methylpropyl (meth)acrylate, 2-hydroxyethyl (meth)acrylate, 2-hydroxypropyl (meth)acrylate, 3-hydroxypropyl (meth)acrylate; α-hydroxymethylacrylic acid esters such as methyl α-hydroxymethyl acrylate, ethyl α-hydroxymethyl acrylate, n-propyl α-hydroxymethyl acrylate, and n-butyl α-hydroxymethyl acrylate; vinyl esters such as vinyl acetate, vinyl propionate, and vinyl butyrate; unsaturated nitryl compounds such as (meth) acrylonitrile, α-chloroacrylonitrile, crotonitrile, maleinitrile, fumaronitrile, mesaconitrile, citraconitrile, and itaconitrile; unsaturated amide compounds such as (meth)acrylamide, N,N-dimethyl(meth)acrylamide, crotonamide, maleinamide, fumaramide, mesaconamide, citraconamide, and itaconamide; other nitrogen-containing vinyl compounds such as N-vinyl-ε-caprolactam, N-vinylpyrrolidone, vinylpyridine, and vinylimidazole; unsaturated carboxylic acids (anhydrides) such as (meth)acrylic acid, crotonic acid, maleic acid, maleic anhydride, fumaric acid, itaconic acid, itaconic anhydride, citraconic acid, citraconic anhydride, and mesaconic acid; carboxyl group-containing esters of unsaturated carboxylic acids such as 2-carboxyethyl (meth)acrylate, 2-carboxypropyl (meth)acrylate, 3-carboxypropyl (meth)acrylate, 4-carboxybutyl (meth)acrylate; and compounds derived from the above (meth)acrylic acid esters having a carboxyl group-containing alicyclic hydrocarbon skeleton, the above unsaturated carboxylic acids, or the above carboxyl group-containing unsaturated carboxylic acid esters by converting the carboxyl groups into the following acid-dissociable organic groups (hereinafter referred to as "acid-dissociable organic group (IV)").

The acid-dissociating organic group (IV) includes the groups obtained by replacing the hydrogen atom on the carboxyl group with a substituted methyl group, 1-substituted ethyl group, 1-branched alkyl group, silyl group, germyl group, alkoxycarbonyl group, acyl group, cyclic acid-dissociating group, or the like. The acid-dissociable group (IV) excludes the groups from which a compound corresponding to (meth)acrylic acid derivatives (β-1) or (meth)acrylic acid derivatives (β-2) is derived when the carboxyl group in (meth)acrylic acid is converted by the acid-dissociable group (IV).

As examples of a substituted methyl group, a methoxymethyl group, methylthiomethyl group, ethoxymethyl group, ethylthiomethyl group, methoxyethoxymethyl group, benzyloxymethyl group, benzylthiomethyl group, phenacylgroup, bromophenacyl group, methoxyphenacyl group, methylthiophenacyl group, α-methylphenacyl group, cyclopropylmethyl group, benzyl group, diphenylmethyl group, triphenylmethyl group, bromobenzyl group, nitrobenzyl group, methoxybenzyl group, methylthiobenzyl group, ethoxybenzyl group, ethylthiobenzyl group, piperonyl group, methoxycarbonylmethyl group, ethoxycarbonylmethyl group, n-propoxycarbonylmethyl group, i-propoxycarbonylmethyl group, n-butoxycarbonylmethyl group, t-butoxycarbonylmethyl group, and the like can be given.

As examples of a 1-substituted methyl group, a 1-methoxyethyl group, 1-methylthioethyl group, 1,1-dimethoxyethyl group, 1-ethoxyethyl group, 1-ethylthioethyl group, 1,1-diethoxyethyl group, 1-phenoxyethyl group, 1-phenylthioethyl group, 1,1-diphenoxyethyl group, 1-benzyloxyethyl group, 1-benzylthioethyl group, 1-cyclopropylethyl group, 1-phenylethyl group, 1,1-diphenylethyl group, 1-methoxycarbonylethyl group, 1-ethoxycarbonylethyl group, 1-n-propoxycarbonylethyl group, 1-i-propoxycarbonylethyl group, 1-n-butoxycarbonylethyl group, 1-t-butoxycarbonylethyl group, and the like can be given.

As examples of a 1-branched alkyl group, an i-propyl group, 1-methylpropyl group, t-butyl group, 1,1- dimethylpropyl group, 1-methylbutyl group, 1,1-dimethylbutyl group, and the like can be given.

As examples of the silyl group, a trimethylsilyl group, ethyldimethylsilyl group, methyldiethylsilyl group, triethylsilyl group, i-propyldimethylsilyl group, methyldi-i-propylsilyl group, tri-i-propylsilyl group, t-butyldimethylsilyl group, methyldi-t-butylsilyl group, tri-t-butylsilyl group, phenyldimethylsilyl group, methyldiphenylsilyl group, triphenylsilyl group, and the like can be given.

As examples of the germyl group, a trimethylgermyl group, ethyldimethylgermyl group, methyldiethylgermyl group, triethylgermyl group, i-propyldimethylgermyl group, methyldi-i-propylgermyl group, tri-i-propylgermyl group, t-butyldimethylgermyl group, methyldi-t-butylgermyl group, tri-t-butylgermyl group, phenyldimethylgermyl group, methyldiphenylgermyl group, triphenylgermyl group, and the like can be given.

As examples of the alkoxycarbonyl group, a methoxycarbonyl group, ethoxycarbonyl group, i-propoxycarbonyl group, t-butoxycarbonyl group, and the like can be given.

As examples of the acyl group, an acetyl group, propionyl group, butyryl group, heptanoyl group, hexanoyl group, valeryl group, pivaloyl group, isovaleryl group, lauryloyl group, myristoyl group, palmitoyl group, stearoyl group, oxalyl group, malonyl group, scucinyl group,-glutaryl group, adipoyl group, piperoyl group, suberoyl group, azelaoyl group, sebacoyl group, acryloyl group, propioloyl group, methacryloyl group, crotonoyl group, oleoyl group, maleoyl group, fumaroyl group, mesaconoyl group, campholoyl group, benzoyl group, phthaloyl group, isophthaloyl group, terephthaloyl group, naphthoyl group, toluoyl group, hydroatropoyl group, atropoyl group, cinnamoyl group, furoyl group, thenoyl group, nicotinoyl group, isonicotinoyl group, p-toluenesulfonyl group, mesyl group, and the like can be given.

As examples of the cyclic acid-dissociable group, a 3-oxocyclohexyl group, tetrahydropyranyl group, tetrahydrofuranyl group, tetrahydrothiopyranyl group, tetrahydrothiofuranyl group, 3-bromotetrahydropyranyl group, 4-methoxytetrahydropyranyl group, 2-oxo-4-methyl-4-tetrahydropyranyl group, 4-methoxytetrahydrothiopyranyl group, 3-tetrahydrothiophene-1,1-dioxide group, and the like can be given.

Given as polyfunctional monomers among the polymerizable unsaturated monomers providing the other recurring units are poly-functional monomers having an alicyclic hydrocarbon skeleton such as 1,2-adamantanediol di(meth)acrylate, 1,3-adamantanediol di(meth)acrylate, 1,4-adamantanediol di(meth)acrylate, and tricyclodecanyldimethylol di(meth)acrylate, as well as methylene glycol di(meth)acrylate, ethylene glycol di(meth) acrylate, propylene glycol di(meth)acrylate, 1,6-hexanediol di(meth)acrylate, 2,5-dimethyl-2,5-hexanediol di(meth)acrylate, 1,8-octanediol di(meth)acrylate, 1,9-nonanediol di(meth) acrylate, 1,4-bis(2-hydroxypropyl)benzene di(meth) acrylate, and 1,3-bis(2-hydroxypropyl)benzene di(meth) acrylate.

As the resin (A1) in the present invention, the resin containing a unit having an alicyclic hydrocarbon skeleton in the main chain and/or the side chain as the recurring unit other than the recurring units (2) or (3) is desirable. Particularly preferable resins are those containing at least one of the units selected from the recurring unit (8) having an alicyclic hydrocarbon skeleton, the recurring unit (9) having an alicyclic hydrocarbon skeleton, and the recurring unit (10).

The total content of the recurring unit (2) and the recurring unit (3) in the resin (A1) is usually 10–70 mol %, preferably 10–60 mol %, and still more preferably 15–60 mol % of the total amount of the recurring units. If the total amount of the above recurring units is less than 10 mol %, developability decreases and undeveloped areas tend to be left after development. If the amount exceeds 70 mol %, on the other hand, resolution capability as a resist tends to decrease.

The total content of the recurring units (8), (9), and (10) in the resin (A1) is usually 5–70 mol %, preferably 5–60 mol %, and still more preferably 10–60 mol % of the total amount of the recurring units. If the total amount of the above recurring units is less than 5 mol %, resolution capability and dry etching resistance as a resist tend to decrease. If the amount exceeds 70 mol %, on the other hand, developability decreases and undeveloped areas tend to be left after development.

The content of other recurring units is usually 60 mol % or less, and preferably 50 mol % or less.

The resin (A1) can be prepared by polymerizing the (meth)acrylic acid derivatives ($\alpha$) and/or norbornene derivatives ($\alpha$), preferably together with at least one of the derivatives selected from the group consisting of acrylic acid derivatives ($\beta$-1), (meth)acrylic acid derivatives ($\beta$-2), and norbornene derivatives ($\beta$-1), and optionally with polymerizable unsaturated monomers which provide the other recurring units in an appropriate solvent using a radical polymerization initiator such as a hydroperoxide, dialkyl iiperoxide, diacyl peroxide, or azo compound and, as required, in the presence of a chain-transfer agent. When the norbornene derivatives (a), or norbornene or a norbornene derivative is used as a polymerizable unsaturated monomer providing the other recurring units, it is desirable to copolymerize maleic anhydride, because copolymerization of maleic anhydride may increase the molecular weight of the resin (A1) to a desired level.

As examples of the solvent used for polymerizing the components, alkanes such as n-pentane, n-hexane, n-heptane, n-octane, n-nonane, and n-decane, cycloalkanes such as cyclohexane, cycloheptane, cyclooctane, decalin, and norbornane; aromatic hydrocarbons such as benzene, toluene, xylene, ethylbenzene, and cumene; halogenated hydrocarbons such as chlorobutanes, bromohexanes, dichloroethanes, hexamethylene dibromide, and chlorobenzene; saturated carboxylic acid esters such as ethyl acetate, n-butyl acetate, i-butyl acetate, and methyl propionate; ethers such as tetrahydrofuran, dimethoxyethanes, and diethoxyethanes; and the like can be given.

These solvents may be used either individually or in combination of two or more.

The polymerization is carried out at a temperature of usually 40–120° C., and preferably 50–90° C. for usually 1–48 hours, and preferably 1–24 hours.

The polystyrene-reduced weight average molecular weight (hereinafter referred to as "Mw") of the resin (A) determined by gel permeation chromatography (GPC) is usually 3,000–300,000, preferably 4,000–200,000, and still more preferably 5,000–100,000. If Mw of the resin (A) is less than 3,000, heat resistance as a resist tends to decrease. If Mw exceeds 300,000, developability as a resist tends to decrease.

The ratio of Mw to the polystyrene-reduced number average molecular weight (hereinafter referred to as "Mn") determined by gel permeation chromatography (GPC) (Mw/Mn) of the resin (A) is usually 1–5, and preferably 1–3.

It is preferable that the resin (A) contains almost no impurities such as halogens or metals. The smaller the amount of such impurities, the better are the sensitivity, resolution, process stability, pattern shape, or the like as a resist. The resin (A) can be purified using, for example, a chemical purification method such as washing with water or liquid-liquid extraction or a combination of the chemical purification method and a physical purification method such as ultrafiltration or centrifugation.

In the present invention, the resin (A) may be used either individually or in combination of two or more.

Component (B)

The component (B) of the present invention is a photoacid generator which generates an acid upon exposure (hereinafter referred to as "acid generator (B)").

The acid generator (B) causes an acid-dissociable group in the resin (A) to dissociate by the action of an acid generated upon exposure. As a result, an exposed part of the resist film becomes readily soluble in an alkaline developer, thereby forming a positive-tone resist pattern.

As examples of the acid generator (B), onium salts, halogen-containing compounds, diazoketone compounds, sulfone compounds, sulfonate compounds, and the like can be given.

Examples of the acid generator (B) are given below.

Onium Salt Compounds:

As examples of onium salt compounds, iodonium salts, sulfonium salts (including tetrahydrothiophenium salts), phosphonium salts, diazonium salts, and pyridinium salts can be given.

Specific examples of onium salt compounds include: diphenyliodoniumtrifluoromethanesulfonate, diphenyliodonium nonafluoro-n-butanesulfonate, diphenyliodonium perfluoro-n-octanesulfonate, diphenyliodonium pyrenesulfonate, diphenyliodonium n-dodecylbenzenesulfonate, diphenyliodonium hexafluoroantimonate, diphenyliodonium naphthalenesulfonate, bis(4-t-butylphenyl)iodonium trifluoromethanesulfonate, bis(4-t-butylphenyl)iodonium nonafluoro-n-butanesulfonate, bis(4-t-butylphenyl) iodonium perfluoro-n-octanesulfonate, bis(4-t-butylphenyl) n-dodecylbenzenesulfonate, bis(4-t-butylphenyl)iodonium hexafluoroantimonate, bis(4-t-butylphenyl)iodonium naphthalenesulfonate, triphenylsulfonium trifluoromethanesulfonate, triphenylsulfonium nonafluoro-n-butanesulfonate, triphenylsulfonium perfluoro-n-octanesulfonate, triphenylsulfonlumn hexafluoroantimonate, triphenylsulfonium naphthalenesulfonate, triphenylsulfonium 10-camphorsulfonate, 4-hydroxyphenyl.phenyl.methylsulfonium p-toluenesulfonate, cyclohexyl.2-oxocyclohexyl.methylsulfonium trifluoromethane sulfonate, dicyclohexy.2-oxocyclohexylsulfoniumn trifluoromethane sulfonate, 2-oxocyclohexyldimethylsulfonium trifluoromethane sulfonate, 4-hydroxy phenyl.benzyl.methylsulfonium p-toluenesulfonate, 1-naphthyldimethylsulfonium trifluoromethanesulfonate, 1-naphthyldiethylsulfonium trifluoromethanesulfonate, 4-cyano-1-naphthyldimethylsulfonium trifluoromethanesulfonate, 4-nitro-1-naphthyldimethylsulfonium trifluoromethanesulfonate, 4-methyl-1-naphthyldimethylsulfonium trifluoromethanesulfonate, 4-cyano-1-naphthyldiethylsulfonium trifluoromethanesulfonate, 4-nitro-1-naphthyldiethylsulfonium trifluoromethanesulfonate, 4-methyl-1-naphthyldiethylsulfonium trifluoromethanesulfonate, 4-hydroxy-1-naphthyldimethylsulfonium trifluoromethanesulfonate, 4-hydroxy-1-naphthyltetrahydrothiophenium trifluoromethanesulfonate, 4-methoxy-1-naphthyltetrahydrothiophenium trifluoromethanesulfonate, 4-ethoxy-1-naphthyltetrahydrothiophenium trifluoromethanesulfonate, 4-n-butoxy-1-naphthyltetrahydrothiophenium nonafluoro-n-butanesulfonate, 4-n-butoxy-1-naphthyltetrahydrothiophenium perfluoro-n-octanesulfonate, 4-methoxymethoxy-1-naphthyltetrahydrothiophenium trifluoromethanesulfonate, 4-ethoxymethoxy-1-naphthyltetrahydrothiophenium trifluoromethanesulfonate, 4-(1'-methoxyethoxy)-1-naphthyltetrahydrothiophenium trifluoromethanesulfonate, 4-(2'-methoxyethoxy)-1-naphthyltetrahydrothiophenium trifluoromethanesulfonate, 4-methoxycarbonyloxy-1-naphthyltetrahydrothiophenium trifluoromethanesulfonate, 4-ethoxycarbonyloxy-1-naphthyltetrahydrothiophenium trifluoromethanesulfonate, 4-n-propoxycarbonyloxy-1-naphthyltetrahydrothiophenium trifluoromethanesulfonate, 4-i-propoxycarbonyloxy-1-naphthyltetrahydrothiophenium trifluoromethanesulfonate, 4-n-butoxycarbonyloxy-1-naphthyltetrahydrothiophenium trifluoromethanesulfonate, 4-t-butoxycarbonyloxy-1-naphthyltetrahydrothiophenium trifluoromethanesulfonate, 4-(2'-tetrahydrofuranyloxy)-1-naphthyltetrahydrothiophenium trifluoromethanesulfonate, 4-(2'-tetrahydropyranyloxy)-1-naphthyltetrahydrothiophenium trifluoromethanesulfonate, 4-benzyloxy-1-naphthyltetrahydrothiophenium trifluoromethanesulfonate, 1-(1'-naphthylacetomethyl) tetrahydrothiophenium trifluoromethanesulfonate, 4-hydroxy-3,5-dimethylphenyl-1-tetrahydrothiophenium trifluoromethanesulfonate, 4-hydroxy-3,5-dimethylphenyl-1-tetrahydrothiophenium nonafluoro-n-butanesulfonate, and 4-hydroxy-3,5-dimethylphenyl-1-tetrahydrothiophenium perfluoro-n-octanesulfonate.

Halogen-containing Compounds:

As examples of halogen-containing compounds, haloalkyl group-containing hydrocarbon compounds, haloalkyl group-containing heterocyclic compounds, and the like can be given.

As specific examples of preferable halogen-containing compounds, (trichloromethyl)-s-triazine derivatives such as phenylbis(trichloromethyl)-s-triazine, 4-methoxyphenylbis (trichloromethyl)-s-triazine, and 1-naphthylbis (trichloromethyl)-s-triazine, 1,1-bis (4'-chlorophenyl)-2,2,2-trichloroethane, and the like can be given.

Diazoketone Compounds:

As examples of diazoketone compounds, 1,3-diketo-2-diazo compounds, diazobenzoquinone compounds, diazonaphthoquinone compounds, and the like can be given.

As specific examples of preferable diazoketone compounds, 1,2-naphthoquinonediazido-4-sulfonyl chloride, 1,2-naphthoquinonediazido-5-sulfonyl chloride, 1,2-naphthoquinonediazido-4-sulfonate or 1,2-naphthoquinonediazido-5-sulfonate of 2,3,4,4'-tetrahydroxybenzophenone, 1,2-naphthoquinonediazido-4-sulfonate or 1,2-naphthoquinonediazido-5-sulfonate of 1,1,1-tris (4'-hydroxyphenyl) ethane, and the like can be given.

Sulfone Compounds:

As examples of sulfone compounds, β-ketosulfone, β-sulfonylsulfone, α-diazo compounds of these compounds, and the like can be given.

As specific examples of preferable sulfone compounds, 4-trisphenacylsulfone, mesitylphenacylsulfone, bis (phenylsulfonyl)methane, and the like can be given.

Sulfonate Compounds:

As examples of sulfonate compounds, alkyl sulfonate, alkylimide sulfonate, haloalkyl sulfonate, aryl sulfonate, imino sulfonate, and the like can be given. As specific examples of preferable sulfone compounds, benzointosylate, tris(trifluoromethanesulfonate) of pyrogallol, nitrobenzyl-9,10-diethoxyanthracene-2-sulfonate, trifluoromethanesulfonylbicyclo[2.2.1]hept-5-ene-2,3-dicarbodiimide, trifluoromethanesulfonylbicyclo[2.2.1]hepto-2-ene-5,6-dicarboduimide, nonafluoro-n-butanesulfonylbicyclo[2.2.1]hept-5-ene-2,3-dicarbodiimide, nonafluoro-n-butanesulfonylbicyclo[2.2.1]hepto-2-ene-5,6-dicarbodiimide, N-hydroxysuccinimidetrifluoromethanesulfonate, 1,8-naphthalenedicarboxylic acid imide trifluoromethanesulfonate, and the like can be given.

Of the above acid generators (B), the following compounds are preferable: diphenyliodoniumtrifluoromethanesulfonate, diphenyliodoniumnonafluoro-n-butanesulfonate, bis(4-t-butylphenyl)iodonium trifluoromethanesulfonate, bis(4-t-butylphenyl)iodonium nonafluoro-n-butanesulfonate, triphenylsulfonium trifluoromethanesulfonate, triphenylsulfonium nonafluoro-n-butanesulfonate, cyclohexyl-2-oxocyclohexyl-methylsulfonium trifluoromethanesulfonate, dicyclohexyl 2-oxocyclohexylsulfonium trifluoromethanesulfonate, 2-oxocyclohexyldimethylsulfonium trifluoromethanesulfonate, 4-hydroxy-1-naphthyldimethylsulfonium trifluoromethanesulfonate, 4-hydroxy-1-naphthyltetrahydrothiophenium trifluoromethanesulfonate, 1-(1'-naphthylacetomethyl) tetrahydrothiophenium trifluoromethanesulfonate, trifluoromethanesulfonylbicyclo[2.2.1]hepto-5-ene-2,3-dicarbodiimide, N-hydroxysuccinimidetrifluoromethanesulfonate, 1,8-naphthalenedicarboxylic acid imido trifluoromethanesulfonate, and the like.

In the present invention, the acid generator (B) may be used either individually or in combination of two or more.

The amount of the acid generator (B) to be used in the present invention is usually 0.1–10 parts by weight, and preferably 0.5–7 parts by weight for 100 parts by weight of the resin (A) from the viewpoint of ensuring sensitivity and developability as a resist. If the amount of the acid generator (B) is less than 0.1 part by weight, sensitivity and developability tend to decrease. If the amount exceeds 10 parts by weight, a rectangular resist pattern may not be obtained due to decreased radiation transmittance.

Additives

It is preferable to add an acid diffusion controller to the radiation-sensitive resin composition of the present invention. The acid diffusion controller controls diffusion of an acid generated from the acid generator (B) upon exposure in the resist film to hinder unfavorable chemical reactions in the unexposed area.

The addition of such an acid diffusion controller improves storage stability of the resulting radiation-sensitive resin composition and resolution as a resist. Moreover, the addition of the acid diffusion controller prevents the line width of the resist pattern from changing due to changes in the post-exposure delay (PED) between exposure and development, whereby a composition with remarkably superior process stability can be obtained.

As the acid diffusion controller, organic compounds containing nitrogen of which the basicity does not change during exposure or heating for forming a resist pattern are preferable.

The following compounds can be given as examples of the nitrogen-containing organic compound: a compound represented by the following formula (12) (hereinafter referred to as "nitrogen-containing compound (a)");

(12)

wherein $R^8$ individually represents a hydrogen atom, a substituted or unsubstituted, linear, branched, or cyclic alkyl group, substituted or unsubstituted aryl group, or substituted or unsubstituted aralkyl group, a compound having two nitrogen atoms in a molecule (hereinafter referred to as "nitrogen-containing compound (b)"); a compound having three or more nitrogen atoms in a molecule (hereinafter referred to as "nitrogen-containing compound (c)"); a compound having at least one amino group with a nitrogen atom having at least one hydrogen atom bonded thereto, wherein at least one of the hydrogen atoms bonded to the nitrogen atom is replaced by a t-butoxycarbonyl group (hereinafter referred to as "nitrogen-containing compound (d)"); other amide group-containing compounds, urea compounds, and other nitrogen-containing heterocyclic compounds.

Examples of the nitrogen-containing compounds (a) include mono(cyclo)alkylamines such as n-hexylamine, n-heptylamine, n-octylamine, n-nonylamine, n-decylamine, and cyclohexylamine; di(cyclo)alkylamines such as di-n-butylamine, di-n-pentylamine, di-n-hexylamine, di-n-heptylamine, di-n-octylamine, di-n-nonylamine, di-n-decylamine, cyclohexylmethylamine, and dicyclohexylamine; tri(cyclo)alkylamines such as triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, cyclohexyldimethylamine, dicyclohexylmethylamine, and tricyclohexylamine; aromatic amines such as aniline, N-methylaniline, N,N-dimethylaniline, 2-methylaniline, 3-methylaniline, 4-methylaniline, 4-nitroaniline, diphenylamine, triphenylamine, and naphthylamine; and the like.

Examples of the nitrogen-containing compound (II) include ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2-bis(4'-aminophenyl)propane, 2-(3'-aminophenyl)-2-(4'-aminophenyl)propane, 2-(4'-aminophenyl)-2-(3'-hydroxyphenyl)propane, 2-(4'-aminophenyl)-2-(4'-hydroxyphenyl)propane, 1,4-bis[1'-(4'-aminophenyl)-1'-methylethyl]benzene, 1,3-bis[1'-(4'-aminophenyl)-1'-methylethyl]benzene, bis(2-diethylaminoethyl)ether, and the like.

Examples of the nitrogen-containing compounds (c) include polyethyleneimine, polyallylamine, a polymer of 2-dimethylaminoethylacrylamide, and the like.

Examples of the nitrogen-containing compound (d) include N-t-butoxycarbonyl di-n-octylamine, N-t-butoxycarbonyl di-n-nonylamine, N-t-butoxycarbonyl di-n-decylamine, N-t-butoxycarbonyl dicyclohexylamine, N-t-butoxycarbonyl-1-adamantylamine, N-t-butoxycarbonyl-N-methyl-1-adamantylamine, N,N-di-t-butoxycarbonyl-1-adamantylamine, N,N-di-t-butoxycarbonyl-N-methyl-1-adamantylamine, N-t-butoxycarbonyl-4,4'-diaminodiphenylmethane, N,N'-di-t-butoxycarbonylhexamethylenediamine, N,N,N'N'-tetra-t-butoxycarbonylhexamethylenediamine, N,N'-di-t-butoxycarbonyl-1,7-diaminoheptane, N,N'-di-t- butoxycarbonyl-1,8-diaminooctane, N,N'-di-t-butoxycarbonyl-1,9-diaminononane, N,N'-di-t-butoxycarbonyl-1,9-diaminodecane, N,N'-di-t-butoxycarbonyl-1,12-diaminododecane, N,N'-di-t-butoxycarbonyl-4,4'-diaminodiphenylmethane, N-t-butoxycarbonylbenzimidazole, N-t-butoxycarbonyl-2-methylbenzimidazole, and N-t-butoxycarbonyl-2-phenylbenzimidazole.

Examples of the other amide group-containing compounds include formamide, N-methylformamide, N,N-dimethylformamide, acetamide, N-methylacetamide, N,N-dimethylacetamide, propionamide, benzamide, pyrrolidone, N-methylpyrrolidone, and the like.

Examples of the urea compounds include urea, methylurea, 1,1-dimethylurea, 1,3-dimethylurea, 1,1,3,3-tetramethylurea, 1,3-diphenylurea, tri-n-butylthiourea, and the like. Examples of the other nitrogen-containing heterocyclic compounds include: imidazoles such as imidazole, benzimidazole, 4-methylimidazole, and 4-methyl-2-phenylimidazole; pyridines such as pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinamide, quinoline, 4-hydroxyquinoline, 8-oxyquinoline, and acridine; piperazines such as piperazine, 1-(2'-hydroxyethyl)piperazine; pyrazine, pyrazole, pyridazine, quinoxaline, purine, pyrrolidine, piperidine, morpholine, 4-methylmorpholine, 1,4-dimethylpiperazine, 1,4-diazabicyclo[2.2.2]octane; and the like.

Of these nitrogen-containing organic compounds, the nitrogen-containing compounds (a), nitrogen-containing compounds (b), nitrogen-containing compounds (c), and nitrogen-containing heterocyclic compounds are preferable.

The acid diffusion controller may be used either individually or in combination of two or more.

The amount of the acid diffusion controller to be added is usually 15 parts by weight or less, preferably 10 parts by weight or less, and still more preferably 5 parts by weight or less for 100 parts by weight of the resin (A). If the proportion of the acid diffusion controller exceeds 15 parts by weight, sensitivity as a resist and developability of the exposed area tend to decrease. If the amount is less than 0.001 part by weight, the pattern shape or dimensional accuracy as a resist may decrease depending on the processing conditions.

Alicyclic additives which further improve dry etching resistance, pattern shape, adhesion to substrate, or the like may be added to the radiation-sensitive resin composition of the present invention.

The following compounds can be given as examples of the alicyclic additives: adamantane derivatives such as t-butyl 1-adamantanecarboxylate, t-butyl 3-adamantanecarboxylate, di-t-butyl 1,3-adamantanedicarboxylate, t-butyl 1-adamantaneacetate, t-butyl 3-adamantaneacetate, di-t-butyl 1,3-adamantanediacetate, and 2,5-dimethyl-2,5-di(adamantylcarbonyloxy)hexane; deoxycholates such as t-butyl deoxycholate, t-butoxycarbonylmethyl deoxycholate, 2-ethoxyethyl deoxycholate, 2-cyclohexyloxyethyl deoxycholate, 3-oxocyclohexyl deoxycholate, tetrahydropyranyl deoxycholate, and mevalonolactone deoxycholate; lithocholates such as t-butyl lithocholate, t-butoxycarbonylmethyl lithocholate, 2-ethoxyethyl lithocholate, 2-cyclohexyloxyethyl lithocholate, 3-oxocyclohexyl lithocholate, tetrahydropyranyl lithocholate, and mevalonolactone lithocholate; and the like.

These alicyclic additives may be used either individually or in combination of two or more.

The amount of the alicyclic additives to be added is usually 50 parts by weight or less, and preferably 30 parts by weight or less for 100 parts by weight of the resin (A). If the amount of alicyclic additives exceeds 50 parts by weight, heat resistance as a resist tends to decrease.

Surfactants which improve applicability, developability, or the like may be added to the radiation-sensitive resin composition of the present invention.

As examples of surfactants, nonionic surfactants such as polyoxyethylene lauryl ether, polyoxyethylene stearyl ether, polyoxyethylene oleyl ether, polyoxyethylene n-octyl phenyl ether, polyoxyethylene n-nonyl phenyl ether, polyethylene glycol dilaurate, polyethylene glycol distearate; commercially available products such as KP341 (manufactured by Shin-Etsu Chemical Co., Ltd.), Polyflow No. 75, No. 95 (manufactured by Kyoeisha Chemical Co., Ltd.), FTOP EF301, EF303, EF352 (manufactured by TOHKEM PRODUCTS CORPORATION), MEGAFAC F171, F173 (manufactured by Dainippon Ink and Chemicals, Inc.), Fluorard FC430, FC431 (manufactured by Sumitomo 3M Ltd.), Asahi Guard AG710, Surflon S-382, SC-101, SC-102, SC-103, SC-104, SC-105, SC-106 (manufactured by Asahi Glass Co., Ltd.); and the like can be given.

These surfactants may be used either individually or in combination of two or more.

The amount of surfactants to be added is usually 2 parts by weight or less for 100 parts by weight of the total of the resin (A) and the acid generator (B).

As other additives, halation inhibitors, adhesion promoters, storage stabilizers, anti-foaming agents, and the like can be given.

Preparation of Composition Solution

The radiation-sensitive resin composition of the present invention is prepared as a composition solution by dissolving the composition in a solvent so that the total solid content is 5–50 wt %, and preferably 10–25 wt %, and filtering the composition using a filter with a pore diameter of about 0.2 μm, for example.

Examples of solvents used for the preparation of the composition solution include: linear or branched ketones such as 2-butanone, 2-pentanone, 3-methyl-2-butanone, 2-hexanone, 4-methyl-2-pentanone, 3-methyl-2-pentanone, 3,3-dimethyl-2-butanone, 2-heptanone, and 2-octanone; cyclic ketones such as cyclopentanone, 3-methylcyclopentanone, cyclohexanone, 2-methylcyclohexanone, 2,6-dimethylcyclohexanone, and isophorone; propylene glycol monoalkyl ether acetates such as propylene glycol monomethyl ether acetate, propylene glycol monoethyl ether acetate, propylene glycol mono-n-propyl ether acetate, propylene glycol mono-i-propyl ether acetate, propylene glycol mono-n-butyl ether acetate, propylene glycol mono-i-butyl ether acetate, propylene glycol mono-sec-butyl ether acetate, and propylene glycol mono-t-butyl ether acetate; alkyl 2-hydroxypropionates such as methyl 2-hydroxypropionate, ethyl 2-hydroxypropionate, n-propyl 2-hydroxypropionate, i-propyl 2-hydroxypropionate, n-butyl 2-hydroxypropionate, i-butyl 2-hydroxypropionate, sec-butyl 2-hydroxypropionate, and t-butyl 2-hydroxypropionate; alkyl 3-alkoxypropionates such as methyl 3-methoxypropionate, ethyl 3-methoxypropionate, methyl 3-ethoxypropionate, and ethyl 3-ethoxypropionate; as well as other solvents such as n-propyl alcohol, i-propyl alcohol, n-butyl alcohol, t-butyl alcohol, cyclohexanol, ethylene glycol monomethyl ether, ethylene glycol monoethyl ether, ethylene glycol mono-n- propyl ether, ethylene glycol mono-n-butyl ether, diethylene glycol dimethyl ether, diethylene glycol diethyl ether, diethylene glycol di-n-propyl ether, diethylene glycol di-n-butyl ether, ethylene glycol monomethyl ether acetate, ethylene glycol monoethyl ether acetate, ethylene glycol mono-n-propyl ether acetate, propylene glycol monomethyl ether, propylene glycol monoethyl ether, propylene glycol mono-n-propyl ether, toluene, xylene, 2-hydroxy-2-methylethyl propionate, ethoxyethyl acetate, ethyl hydroxyacetate, methyl 2-hydroxy-3-methylbutyrate, 3-methoxybutylacetate, 3-methyl-3-methoxybutylacetate, 3-methyl-3-methoxybutylpropionate, 3-methyl-3-methoxybutylbutyrate, ethyl acetate, n-propyl acetate, n-butylacetate, methyl acetoacetoate, ethyl acetoacetate, methyl pyruvate, ethyl pyruvate, N-methyl pyrrolidone, N,N-dimethylformamide, N,N-dimethylacetamide, benzyl ethyl ether, di-n-hexyl ether, diethylene glycol monomethyl ether, diethylene glycol monoethyl ether, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, and propylene carbonate.

These solvents may be used either individually or in combination of two or more. Among these solvents, linear or branched ketones, cyclic ketones, propylene glycol monoalkyl ether acetates, alkyl 2-hydroxypropionates, and alkyl 3-alkoxypropionates are preferable.

Formation of Resist Pattern

The radiation-sensitive resin composition of the present invention is particularly useful as a chemically-amplified positive-tone resist.

In the chemically-amplified positive-tone resist, an acid-dissociable group in the resin (A) dissociates by the action of an acid generated from the acid generator (B) upon exposure, thereby producing an acidic functional group, preferably a carboxyl group. As a result, solubility of the exposed part of the resist in an alkaline developer increases, whereby the exposed part is dissolved in an alkaline developer and removed to obtain a positive-tone resist pattern.

A resist pattern is formed from the radiation-sensitive resin composition of the present invention by applying the composition solution to, for example, substrates such as a silicon wafer or a wafer coated with aluminum using an appropriate application method such as rotational coating, cast coating, and roll coating to form a resist film. The resist film is then optionally pre-baked (hereinafter called "PB") and exposed to form a predetermined resist pattern. As radiation used for exposure, visible rays, ultraviolet rays, deep ultraviolet rays, X-rays, electron beams, or the like is appropriately selected depending on types of the acid generator. It is particularly preferable to use an ArF excimer laser (wavelength: 193 nm) or KrF excimer laser (wavelength: 248 nm).

In the present invention, it is preferable to perform post-exposure bake (hereinafter called "PEB") after exposure. PEB ensures smooth dissociation of the acid-dissociable organic group in the resin (A). The heating temperature for PEB is usually 30–200° C., and preferably 50–170° C., although the heating conditions vary depending on the composition of the radiation-sensitive resin composition.

In order to bring out latent capability of the radiation-sensitive resin composition of the present invention, an organic or inorganic anti-reflection film may be formed on a substrate as disclosed in Japanese Patent Publication No. 12452/1994, for example. Moreover, a protection film may be formed on the resist film as disclosed in Japanese Patent Publication No. 188598/1993 or the like in order to prevent the effects of basic impurities or the like in an environmental atmosphere. These techniques may be employed in combination.

The exposed resist film is then developed to form a predetermined resist pattern.

As examples of a developer used for development, it is preferable to use an alkaline aqueous solution prepared by dissolving at least one of alkaline compounds such as sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, ethyldimethylamine, triethanolamine, tetramethylammonium hydroxide, pyrrole, piperidine, choline, 1,8-diazabicyclo[5.4.0]-7-undecene, and 1,5-diaza bicyclo [4.3.0]-5-nonene.

The concentration of the alkaline aqueous solution is usually 10 wt % or less. If the concentration of the alkaline aqueous solution exceeds 10 wt %, an unexposed area may be dissolved in the developer.

Organic solvents or the like may be added to the developer containing an alkaline aqueous solution.

As examples of organic solvents, linear, branched, or cyclic ketones such as acetone, methyl ethyl ketone, methyl i-butyl ketone, cyclopentanone, cyclohexanone, 3-methylcyclopentanone, and 2,6-dimethylcyclohexanone; alcohols such as methylalcohol, ethylalcohol, n-propylalcohol, i-propylalcohol, n-butylalcohol, t-butylalcohol, cyclopentanol, cyclohexanol, 1,4-hexanediol, and 1,4-hexanedimethylol; ethers such as tetrahydrofuran and dioxane; esters such as ethyl acetate, n-butyl acetate, and i-amyl acetate; aromatic hydrocarbons such as toluene and xylene; phenol, acetonylacetone, dimethylformamide; and the like can be given.

These organic solvents may be used either individually or in combination of two or more.

The amount of the organic solvents is preferably 100 vol % of the alkaline aqueous solution. If the amount of the organic solvents exceeds 100 vol %, an exposed area may remain undeveloped due to decreased developability.

In addition, surfactants or the like may be added to the developer containing the alkaline aqueous solution in an appropriate amount.

The resist film is generally washed with water after development using a developer containing an alkaline aqueous solution.

EXAMPLES

The embodiments of the present invention will be described in more detail by examples. However, these examples should not be construed as limiting the present invention. In the examples, part(s) refers to part(s) by weight unless otherwise indicated.

Measurement and evaluation of each composition in the examples and comparative examples were carried out as follows.

Mw:

Mw was measured by gel permeation chromatography (GPC) using GPC columns (manufactured by Tosoh Corp., G2000HXL×2, G3000HXL×1, G4000HXL×1) under the following conditions.

Flow rate: 1.0 ml/minute

Eluate: tetrahydrofuran

Column temperature: 40° C.

Standard reference material: monodispersed polystyrene

Radiation Transmittance:

A solution composition was applied to a quartz plate and the coating was post-baked on a hot plate at 90° C. for 60 seconds to obtain a resist coating with a thickness of 1 μm. Radiation transmittance of the resist coating was calculated from absorbance at a wavelength of 193 nm and was adopted as a standard for transparency in the deep UV ray region.

Sensitivity:

A solution composition was applied to a silicon wafer with a 520 Å thickness Deep UV30 film (manufactured by Brewer Science Corp.) coated on the surface by spin coating and post-baked on a hot plate under the conditions shown in Table 2 to obtain a resist coating with a thickness of 0.4 μm. The coating was exposed to radiation through a mask pattern using an ArF excimer laser exposure apparatus (manufactured by Nikon Corp., lens numerical aperture: 0.55, wavelength: 193 nm). After PEB under the conditions shown in Table 2, the resist coatings were developed in a 2.38 wt % tetramethylammonium hydroxide aqueous solution (Example 1) or 2.38×1/50 wt % tetramethylammonium hydroxide aqueous solution (Comparative Example 4) at 25° C. for 60 seconds. The resist coatings in Examples 8–11 were developed in a 2.38 wt % tetramethylammonium hydroxide aqueous solution at 25° C. for 40 seconds. The resist films were then washed with water and dried to obtain positive-tone resist patterns. An optimum dose at which a line-and-space (1L1S) pattern with a line width of 0.18 μm was formed was taken as sensitivity.

Resolution:

The minimum dimension of the resist pattern resolved at the optimum dose was taken as the resolution of the resist coating.

Defective Development:

Defective development was evaluated by observing the presence or absence of the defective development using an optical microscope and a KLA defect inspection device (manufactured by KLA-TENCOR JAPAN LTD.) by the following procedure.

Evaluation Procedure using KLA Defect Inspection Device:

The total number of defective clusters and unclusters in one piece of wafer extracted from the difference produced by superposing reference images and pixels was counted by array mode observation using the KLA defect inspection device of which the sensitivity was set to detect defects with a size 0.15 μm or greater.

Pattern Configuration:

The length of the bottom ($L_1$) and top ($L_2$) of a square cross-section of a line-and-space (1L1S) pattern with a line width of 0.20 μm was measured by a scanning electron microscope.

The pattern configuration was judged as "Good" when $0.85 \leq L_2/L_1 \leq 1$ was satisfied and the pattern did not have a skirt-like extension.

Synthesis of Monomers

Synthesis Example 1

(a) Oxidation Reaction

A two liter three-necked flask was charged with 202 g of 4,5-diacetoxypentanal, 121 g of distilled water, 606 g of methylene chloride, 14 g of potassium dihydrogenphosphate, and 2.62 g of 4-benzyloxy-2,2,6,6-tetramethyl-1-piperidinoxy. 602 g of 13 wt % aqueous solution of sodium hypochlorite was added dropwise to the mixture over one hour while vigorously stirring the reaction mixture and maintaining the temperature at 5–10° C. After the addition, the mixture was stirred for 0.5 hour at the same temperature. The resulting reaction solution was analyzed by gas chromatography (GPC) to confirm that the conversion rate of aldehyde groups to carboxyl groups was 100%.

The reaction solution was allowed to stand to separate the water layer from the methylene chloride layer. The water layer was extracted with 300 g of methylene chloride. After combining the methylene chloride layer and the methylene chloride extract, methylene chloride was evaporated to obtain 202 g of a crude product. The crude product was purified by vacuum distillation to obtain 171 g of 4,5-diacetoxypentanoic acid. The yield on the basis of 4,5-diacetoxtpentanal was 74 mol %.

(b) Hydrolysis and Cyclization Reaction

A 500 ml three-necked flask was charged with 116 g of 4,5-diacetoxypentanoic acid obtained in (a) above and 280 g of an aqueous solution of 25 wt % sodium hydroxide. The mixture was stirred for three hours while maintaining the temperature at 75–80° C. After cooling to 30° C., the reaction solution was dropped into a 1 l three-necked flask which contained 490 g of 40 wt % sulfuric acid aqueous solution. After the addition, the mixture was stirred for three hours while maintaining the temperature at 75–80° C. The resulting reaction solution was analyzed by gas chromatography (GPC) to confirm that the conversion rate of 4,5-diacetoxypentanoic acid to 4-hydroxymethyl-γ-butyrolactone was 100%.

The reaction solution was neutralized with sodium hydrogencarbonate, extracted with 300 g of methylene chloride three times. The methylene chloride extracts were combined and methylene chloride was evaporated to obtain 46 g of a crude product. The crude product was purified by vacuum distillation to obtain 34 g of 4-hydroxymethyl-γ-butyrolactone. The yield on the basis of 4,5-diacetoxtpentanoic acid was 57 mol %.

(c) Methacrylation Reaction

A 1 l three-necked flask was charged with 58 g of 4-hydroxymethyl-γ-butyrolactone obtained in (b) above, 500 g of methylene chloride, and 60.6 g of triethylamine. The mixture was stirred while maintaining the temperature at 0–5° C. and 62.5 g of methacryloyl chloride was added dropwise over one hour. After the addition, the mixture was stirred for one hour at the same temperature, allowed to cool to room temperature, and stirred for a further six hours.

The reaction solution was filtered to separate by-produced triethylamine hydrochloride. 500 g of ethyl acetate and 500 g of n-hexane were added to the filtrate. After the addition of 1 l of an aqueous solution of sodium carbonate, the mixture was washed with water. The upper organic layer was further washed twice with 1 l of distilled water and the organic solvent was evaporated to obtain 82 g of a crude product. The crude product was purified by vacuum distillation to obtain 58 g of 4-methacryloyloxymethyl-γ-butyrolactone of the previously described formula (6-2). The yield on the basis of 4-hyroyloxymethyl-γ-butyrolactone was 55 mol %.

Synthesis Example 2

50 g of 4-acryloyloxymethyl-γ-butyrolactone of the previously described formula (6-1) was obtained in the same manner as in Synthesis Example 1, except that 54 g of acryloyl chloride was used instead of 62.5 g of methacryloyl chloride.

50 g of 4-acryloyloxymethyl-γ-butyrolactone was dissolved in 200 ml of tetrahydrofuran and 50 ml of cyclopentadiene was slowly dropped into the solution in a water bath. After the addition, the mixture was allowed to cool to room temperature, and stirred for 12 hours. Analysis of the reaction solution by gel chromatography confirmed progress of the Diels-Alder reaction. The reaction solution was distilled under vacuum to obtain 50 g of 5-[(4-γ-butyrolactone)

methyloxycarbonyl]norbornene of the above formula (7-1). The yield on the basis of 4-acryloyloxymethyl-γ-butyrolactone was 52 mol %.

Synthesis Example 3

144.17 g of 4-hydroxymethyl-3,3-dimethyl-γ-butyrolactone and 121.2 g of triethylamine were dissolved in 500 ml of dichloromethane and 100 g of acryloyl chloride was slowly dropped into the solution in a water bath. After the addition, the mixture was allowed to cool to room temperature, and stirred for 6 hours. Analysis of the reaction solution by gel chromatography confirmed progress of the esterification reaction. After separating solid triethylamine hydrochloride in the reaction solution by filtration, the reaction solution was transferred to a separating funnel and washed until neutralized. The organic layer was dehydrated by mixing with magnesium sulfate. After removing the magnesium sulfate, dichloromethane was evaporated under vacuum to obtain 158 g of (4-methylene-3,3-dimethyl-γ-butyrolactone)acrylate of the above formula (6-25). The yield on the basis of 4-hyroyloxymethyl-3,3-dimethyl-γ-butyrolactone was 80%.

Synthesis Example 4

144.17 g of 4-hydroxymethyl-3,3-dimethyl-γ-butyrolactone and 121.2 g of triethylamine were dissolved in 500 ml of dichloromethane and 115 g of methacryloyl chloride was slowly dropped into the solution in a water bath. After the addition, the mixture was allowed to cool to room temperature, and stirred for 6 hours. Analysis of the reaction solution by gel chromatography confirmed progress of the esterification reaction. The reaction product was processed in the same manner as in Synthesis Example 3 to obtain 161 g of (4-methylene-3,3-dimethyl-γ-butyrolactone) methacrylate of the formula (6-26). The yield on the basis of 4-hyroyloxymethyl-3,3-dimethyl-γ-butyrolactone was 78%.

Synthesis Example 5

A three-necked flask was charged with 99 g of (4-methylene-3,3-dimethyl-γ-butyrolactone)acrylate. After replacing the internal atmosphere of the flask with nitrogen, the flask was heated to about 50° C. 30 ml of previously prepared cyclopentadiene was slowly dropped into the flask in the nitrogen atmosphere while controlling the temperature below 80° C. After the addition, the mixture was stirred for 6 hours at 60° C. and allowed to cool to room temperature. Analysis of the reaction solution by gel chromatography confirmed that the conversion rate of the addition reaction of (4-methylene-3, 3-dimethyl-γ-butyrolactone) acrylate and cyclopentadiene was 80%. The reaction solution was distilled under vacuum to obtain 90 g of 5-(4'-methylene-3',3'-dimethyl-γ-butyrolactone) oxycarbonylnorbornene. The yield on the basis of (4-methylene-3,3-dimethyl-γ-butyrolactone)acrylate was 65%.

Synthesis of Resin (A1)

Synthesis Example 6

25 g of 4-methacryloyloxymethyl-γ-butyrolactone, 25 g of 2-methacryloyloxy-2-methyladamantane, and 0.7 g of 3-mercaptopropionic acid were dissolved in 50 g of tetrahydrofuran to obtain a homogeneous solution. After injection of nitrogen for 30 minutes, 3 g of azobisisobutyronitrile was added as an initiator. The mixture was heated to 65° C. and stirred for 4 hours at this temperature. After the reaction, the reaction solution was cooled to room temperature and diluted with 50 g of tetrahydrofuran. The diluted solution was poured into 1,000 ml of n-hexane to cause the resin to precipitate. The precipitated resin was filtered and recovered as white resin powder.

The resulting resin was confirmed to be a copolymer with a copolymerization molar ratio of the recurring unit (i-1) and recurring unit (i-2), shown in the following formulas (13), of 45:55, and having Mw of 7,500. This resin is referred to as a "resin (A-1)".

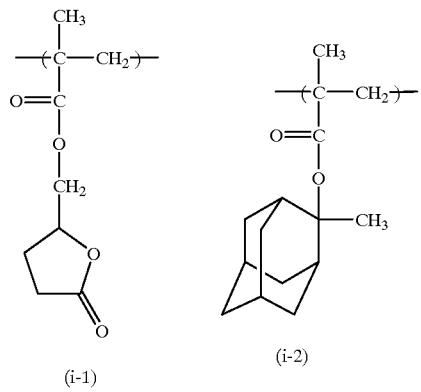

(13)

Synthesis Example 7

15 g of 4-methacryloyloxymethyl-γ-butyrolactone, 20 g of 2-methacryloyloxy-2-methyladamantane, 15 g of 1-methacryloyloxy-3-hydroxyadamantine, and 0.7 g of 3-mercaptopropionic acid were dissolved in 50 g of tetrahydrofuran to obtain a homogeneous solution. After injection of nitrogen for 30 minutes, 3 g of azobisisobutyronitrile was added as an initiator. The mixture was heated to 65° C. and stirred for 4 hours at this temperature. After the reaction, the reaction solution was cooled to room temperature and diluted with 50 g of tetrahydrofuran. The diluted solution was poured into 1,000 ml of n-hexane to cause the resin to precipitate. The precipitated resin was filtered and recovered as white resin powder.

The resulting resin was confirmed to be a copolymer with a copolymerization molar ratio of the recurring unit (ii-1), recurring unit (ii-2), and recurring unit (ii-3), shown in the following formulas (14), of 30:40:30, and having Mw of 8,100. This resin is referred to as a "resin (A-2)".

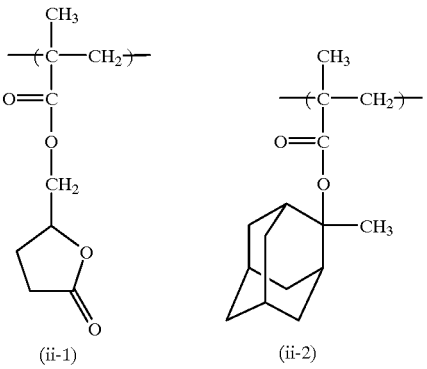

(14)

-continued

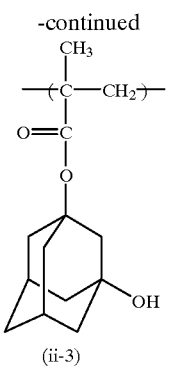

(ii-3)

Synthesis Example 8

25 g of 4-methacryloyloxymethyl-γ-butyrolactone, 25 g of 2-(2'-methacryloyloxy-2'-propyl)norbornane, and 0.7 g of 3-mercaptopropionic acid were dissolved in 50 g of tetrahydrofuran to obtain a homogeneous solution. After injection of nitrogen for 30 minutes, 3 g of azobisisobutyronitrile was added as an initiator. The mixture was heated to 65° C. and stirred for 4 hours at this temperature. After the reaction, the reaction solution was cooled to room temperature and diluted with 50 g of tetrahydrofuran. The diluted solution was poured into 1,000 ml of n-hexane to cause the resin to precipitate. The precipitated resin was filtered and recovered as white resin powder.

The resulting resin was confirmed to be a copolymer with a copolymerization molar ratio of the recurring unit (iii-1) and recurring unit (iii-2), shown in the following formulas (15), of 45:55, and having Mw of 8,900. This resin is referred to as a "resin (A-3)".

(15)

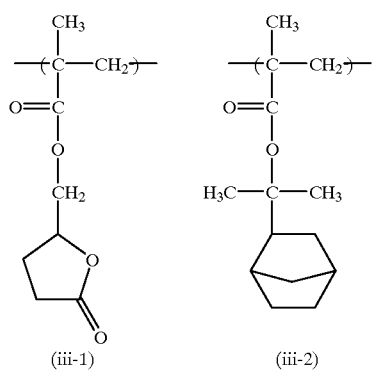

(iii-1)    (iii-2)

Synthesis Example 9

15 g of 4-methacryloyloxymethyl-γ-butyrolactone, 15 g of 2-(2'-methacryloyloxy-2'-propyl)norbornane, 20 g of 1-methacryloyloxy-3-hydroxyadamantine, and 0.7 g of 3-mercaptopropionic acid were dissolved in 50 g of tetrahydrofuran to obtain a homogeneous solution. After injection of nitrogen for 30 minutes, 3 g of azobisisobutyronitrile was added as an initiator. The mixture was heated to 65° C. and stirred for 4 hours at this temperature. After the reaction, the reaction solution was cooled to room temperature and diluted with 50 g of tetrahydrofuran. The diluted solution was poured into 1,000 ml of n-hexane to cause the resin to precipitate. The precipitated resin was filtered and recovered as white resin powder.

The resulting resin was confirmed to be a copolymer with a copolymerization molar ratio of the recurring unit (iv-1), recurring unit (iv-2), and recurring unit (iv-3), shown in the following formulas (16), of 30:30:40, and having Mw of 9,200. This resin is referred to as a "resin (A-4)".

(16)

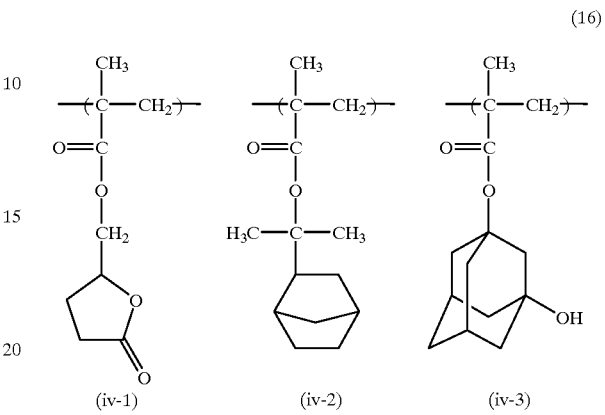

(iv-1)    (iv-2)    (iv-3)

Synthesis Example 10

25 g of 4-methacryloyloxymethyl-γ-butyrolactone, 15 g of 2-(2'-methacryloyloxy-2'-propyl)norbornane, 5 g of norbornene, 5 g of maleic anhydride, and 0.7 g of 3-mercaptopropionic acid were dissolved in 50 g of tetrahydrofuran to obtain a homogeneous solution. After injection of nitrogen for 30 minutes, 3 g of azobisisobutyronitrile was added as an initiator. The mixture was heated to 65° C. and stirred for 4 hours at this temperature. After the reaction, the reaction solution was cooled to room temperature and diluted with 50 g of tetrahydrofuran. The diluted solution was poured into 1,000 ml of n-hexane to cause the resin to precipitate. The precipitated resin was filtered and recovered as white resin powder. The resulting resin was confirmed to be a copolymer with a copolymerization molar ratio of the recurring unit (v-1), recurring unit (v-2), recurring unit (v-3), and recurring unit (v-4), shown in the following formulas (17), of 40:30:15:15, and having Mw of 7,500. This resin is referred to as a "resin (A-5)".

(17)

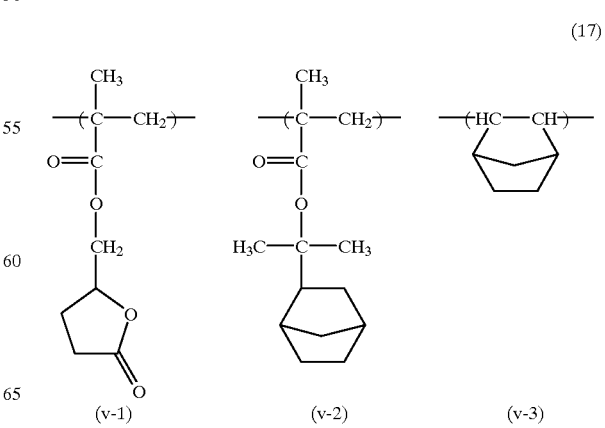

(v-1)    (v-2)    (v-3)

-continued

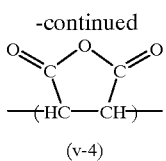

(v-4)

Synthesis Example 11

15.5 g of 5-[(4'-γ-butyrolactone)methyloxycarbonyl] norbornene, 23 g of 2-methacryloyloxy-2-methylamantane, 2.5 g of norbornene, and 9 g of maleic anhydride were dissolved in 50 g of tetrahydrofuran to obtain a homogeneous solution. After injection of nitrogen for 30 minutes, 3 g of azobisisobutyronitrile was added as an initiator. The mixture was heated to 65° C. and stirred for 4 hours at this temperature. After the reaction, the reaction solution was cooled to room temperature and diluted with 50 g of tetrahydrofuran. The diluted solution was poured into 1,000 ml of n-hexane to cause the resin to precipitate. The precipitated resin was filtered and recovered as white resin powder.

The resulting resin was confirmed to be a copolymer with a copolymerization molar ratio of the recurring unit (vi-1), recurring unit (vi-2), recurring unit (vi-3), and recurring unit (vi-4), shown in the following formulas (18), of 22:35:10:33, and having Mw of 7,500. This resin is referred to as a "resin (A-6)".

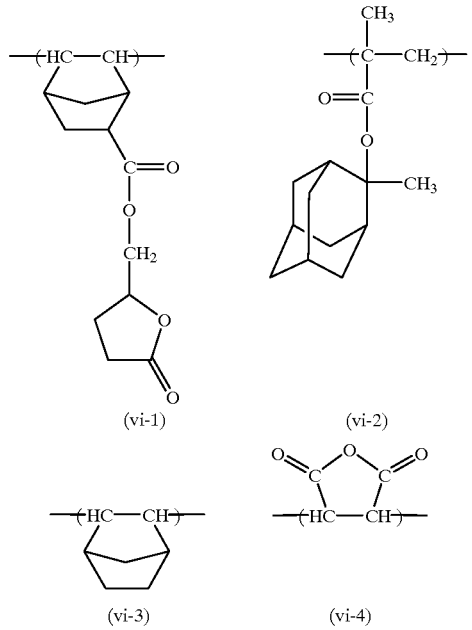

Synthesis Example 12

15.5 g of 5-[(4'-γ-butyrolactone)methyloxycarbonyl] norbornene, 23 g of 2-(2'-methacryloyloxy-2'-propyl) norbornene, 2.5 g of norbornene, and 9 g of malic anhydride were dissolved in 50 g of tetrahydrofuran to obtain a homogeneous solution. After injection of nitrogen for 30 minutes, 3 g of azobisisobutyronitrile was added as an initiator. The mixture was heated to 65° C. and stirred for 4 hours at this temperature. After the reaction, the reaction solution was cooled to room temperature and diluted with 50 g of tetrahydrofuran. The diluted solution was poured into 1,000 ml of n-hexane to cause the resin to precipitate. The precipitated resin was filtered and recovered as white resin powder.

The resulting resin was confirmed to be a copolymer with a copolymerization molar ratio of the recurring unit (vii-1), recurring unit (vii-2), recurring unit (vii-3), and recurring unit (vii-4), shown in the following formulas (19), of 22:35:10:33, and having Mw of 7,800. This resin is referred to as a "resin (A-7)".

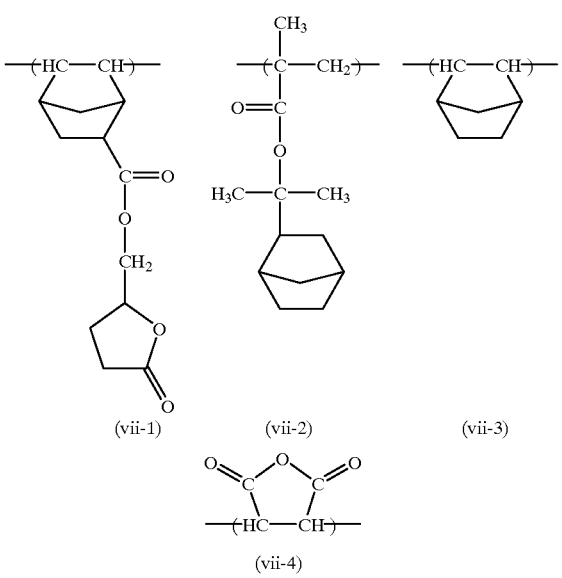

Synthesis Example 13

23.76 g of (4-methylene-3,3-dimethyl-γ-butyrolactone) methacrylate and 26.24 g of 2-methacryloyloxy-2-methyladamamtane were dissolved in 150 g of tetrahydrofuran in nitrogen atmosphere to obtain a homogeneous solution. 4.12 g of dimethyl azobisisobutanoate and 1.35 g of t-dodecylmercaptan were added to and dissolved in the mixture while stirring. The mixture was then heated to 70° C. and stirred for 4 hours. After the reaction, the reaction solution was allowed to cool to room temperature and poured into 1,000 g of methanol to cause the resin to precipitate. The precipitated resin was filtered and dried under vacuum to recover the resin as white resin powder.

The resulting resin was confirmed to be a copolymer with a copolymerization molar ratio of the recurring unit (viii-1) and recurring unit (viii-2), shown in the following formulas (20), of 49.4:50.6, and having Mw of 12,000. This resin is referred to as a "resin (A-8)".

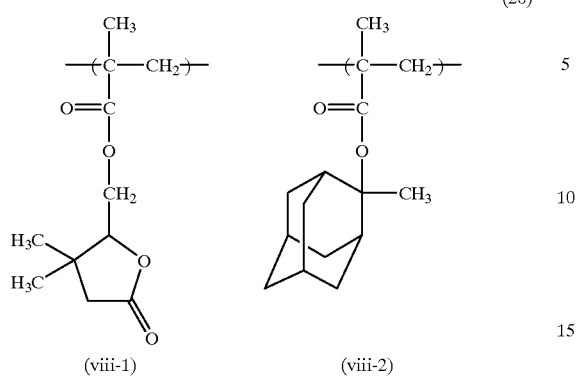

(viii-1)    (viii-2)

Synthesis Example 14

11.56 g of (4-methylene-3,3-dimethyl-γ-butyrolactone) methacrylate, 22.99 g of 2-methacryloyloxy-2-methacryloyloxy-2-methyladamantane, and 15.45 g of 1-methacryloyloxy-3-hydroxyadamantane were dissolved in 150 g of tetrahydrofuran in nitrogen atmosphere to obtain a homogeneous solution. 4.01 g of dimethyl azobisisobutanoate and 1.31 g of t-dodecylmercaptan were added to and dissolved in the mixture while stirring. The mixture was then heated to 70° C. and stirred for 4 hours. After the reaction, the reaction solution was allowed to cool to room temperature and poured into 1,000 g of methanol to cause the resin to precipitate. The precipitated resin was filtered and dried under vacuum to recover the resin as white resin powder.

The resulting resin was confirmed to be a copolymer with a copolymerization molar ratio of the recurring unit (ix-1), recurring unit (ix-2), and recurring unit (ix-3), shown in the following formulas (21), of 24.2:46.3:29.5, and having Mw of 11,700. This resin is referred to as a "resin (A-9)".

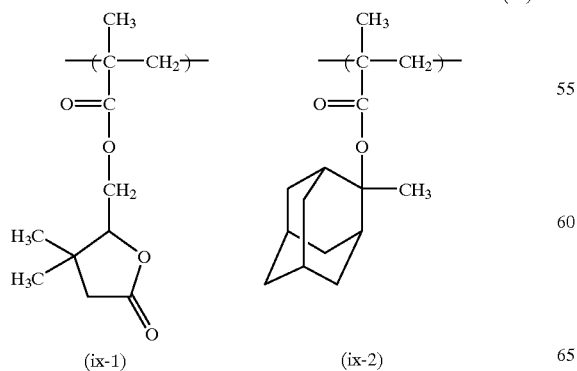

(ix-1)    (ix-2)

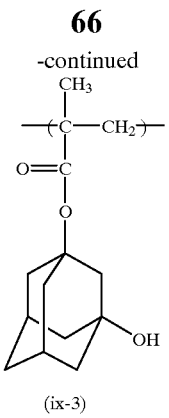

(ix-3)

Synthesis Example 15

8.63 g of 5-(4'-methylene-3',3'-dimethyl-γ-butyrolactone) oxycarbonylnorbornene, 16.00 g of maleic anhydride, and 25.37 g of 5-t-butoxycarbonylnorbornene were dissolved in 50 g of n-butyl acetate in nitrogen atmosphere to obtain a homogeneous solution. 6.01 g of dimethyl azobisisobutanoate was added to and dissolved in the mixture while stirring. The mixture was then heated to 70° C. and stirred for 6 hours. After the reaction, the reaction solution was allowed to cool to room temperature, diluted with 100 g of tetrahydrofuran. The diluted solution was poured into 1,000 g of n-heptane to cause the resin to precipitate. The precipitated resin was filtered and dried under vacuum to recover the resin as white resin powder.

The resulting resin was confirmed to be a copolymer with a copolymerization molar ratio of the recurring unit (x-1), recurring unit (x-2), and recurring unit (x-3), shown in the following formulas (22), of 9.8:50.4:39.8, and having Mw of 7,200. This resin is referred to as a "resin (A-10)".

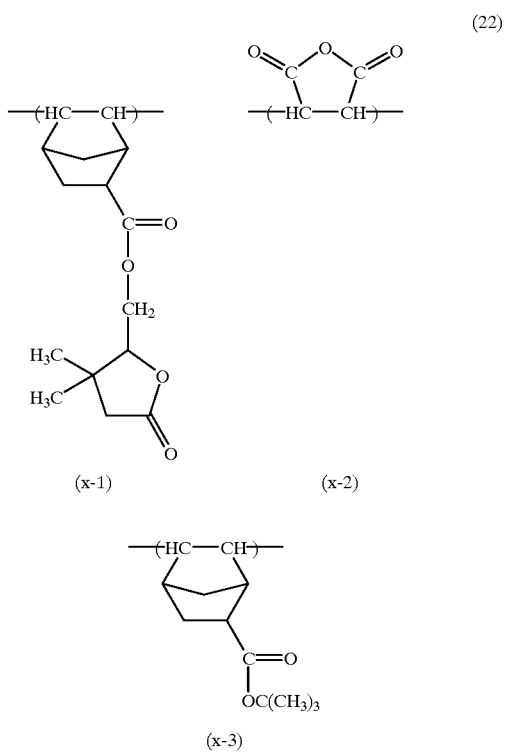

(x-1)    (x-2)

(x-3)

Synthesis Example 16

8.15 g of 5-(4'-methylene-3',3'-dimethyl-γ-butyrolactone) oxycarbonylnorbornene, 13.61 g of maleic anhydride, 20.98 g of 5-t-butoxycarbonylnorbornene, and 7.26 g of 2-methacryloyloxy-2-methyladamantine were dissolved in 50 g of n-butyl acetate in nitrogen atmosphere to obtain a homogeneous solution. 5.68 g of dimethyl azobisisobutanoate was added to and dissolved in the mixture while stirring. The mixture was then heated to 70° C. and stirred for 6 hours. After the reaction, the reaction solution was allowed to cool to room temperature, diluted with 100 g of tetrahydrofuran. The diluted solution was poured into 1,000 g of n-heptane to cause the resin to precipitate. The precipitated resin was filtered and dried under vacuum to recover the resin as white resin powder.

The resulting resin was confirmed to be a copolymer with a copolymerization molar ratio of the recurring unit (xi-1), recurring unit (xi-2), recurring unit (xi-3), and recurring unit (xi-4), shown in the following formulas (23), of 9.6:46.3:34.4:9.7, and having Mw of 7,200. This resin is referred to as a "resin (A-11)".

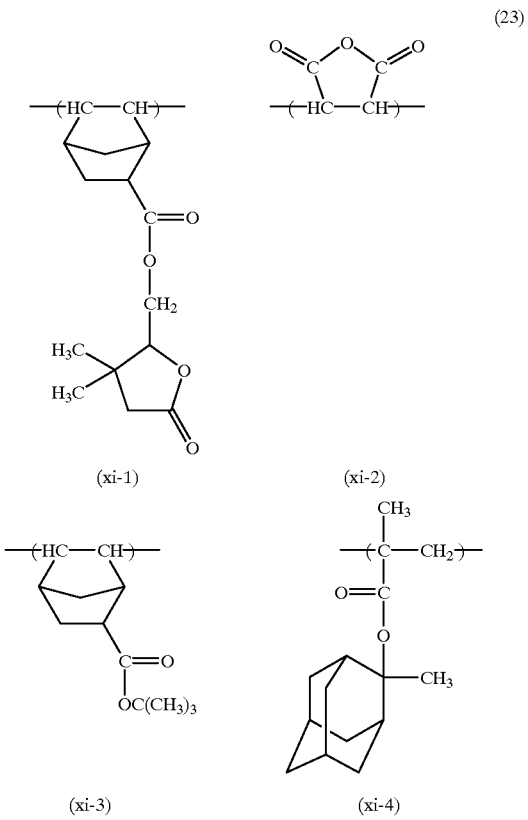

(23)

(xi-1)  (xi-2)
(xi-3)  (xi-4)

Examples 1–11 and Comparative Example 1

Each composition solution having components shown in Table 1 was evaluated. The evaluation results are shown in Table 3.

Components other than the resins (A-1) to (A-11) shown in Table 1 are as follows.

Other Resins a-1: t-Butyl methacrylate/methyl methacrylate/methacrylic acid copolymer (copolymerization molar ratio=40/40/20, Mw=20,000)

Acid Generator (B)

B-1: Triphenylsulfonium nonafluoro-n-butanesulfonate
B-2: Bis(4-t-butylphenyl)iodonium nonafluoro-n-butanesulfonate
B-3: 4-n-Butoxy-1-naphthyltetrahydrothiophenium nonafluoro-n-butanesulfonate
B-4: 4-n-Butoxy-1-naphthyltetrahydrothiophenium perfluoro-n-octanesulfonate
B-5: 4-Hydroxy-3,5-dimethylphenyl-1-tetrahydrothiophenium nonafluoro-n-butanesulfonate
B-6: 4-Hydroxy-3,5-dimethylphenyl-1-tetrahydrothiophenium perfluoro-n-octanesulfonate
B-7: Nonafluoro-n-butanesulfonylbicyclo[2.2.1]-hepto-2-ene-5,6-dicarbodiimide Acid Diffusion Control Agent C-1: Tri-n-octylamine
C-2: Bis(2-dimethylaminoethyl)ether
C-3: N-t-butoxycarbonyl-2-phenylbenzimidazole
C-4: N-t-butoxycarbonyldicyclohexylamine Other Additives D-1: t-Butyl deoxycholate
D-2: t-Butoxycarbonylmethyl deoxycholate
D-3: Di-t-butyl 1,3-adamantanedicarboxylate
D-4: 2,5-Dimethyl-2,5-di(adamantylcarbonyloxy)hexane Solvent E-1: 2-Heptanone
E-2: Cyclohexanone
E-3: Propylene glycol monomethyl ether acetate
E-4: γ-Butyrolactone

TABLE 1

| | Resin (parts) | Acid Generator (B) (parts) | Acid Diffusion Control Agent (parts) | Other Additives (parts) | Solvent (parts) |
|---|---|---|---|---|---|
| Example 1 | A-1 (90) | B-1 (2) | C-1 (0.05) | D-1 (10) | E-1 (430) E-2 (100) |
| Example 2 | A-2 (90) | B-2 (2) | C-2 (0.05) | D-1 (10) | E-1 (430) E-2 (100) |
| Example 3 | A-3 (90) | B-1 (2) | C-2 (0.05) | D-1 (10) | E-1 (430) E-2 (100) |
| Example 4 | A-4 (90) | B-2 (2) | C-1 (0.05) | D-1 (10) | E-1 (430) E-2 (100) |
| Example 5 | A-5 (90) | B-2 (2) | C-1 (0.05) | D-1 (10) | E-1 (430) E-2 (100) |
| Example 6 | A-6 (90) | B-1 (2) | C-2 (0.05) | D-1 (10) | E-1 (430) E-2 (100) |
| Example 7 | A-7 (90) | B-2 (2) | C-1 (0.05) | D-1 (10) | E-1 (430) E-2 (100) |
| Example 8 | A-8 (100) | B-2 (2) B-3 (3) | C-3 (0.10) | — | E-1 (430) E-2 (100) |
| Example 9 | A-9 (95) | B-4 (3) B-5 (2) | C-4 (0.10) | D-2 (5) | E-1 (430) E-2 (100) |
| Example 10 | A-10 (90) | B-5 (3) B-7 (2) | C-3 (0.10) | D-3 (10) | E-3 (630) |
| Example 11 | A-11 (90) | B-6 (3) B-7 (3) | C-3 (0.08) C-4 (0.02) | D-4 (10) | E-3 (630) |
| Comparative Example 1 | a-1 (90) | B-1 (2) | C-1 (0.05) | D-1 (10) | E-1 (530) |

TABLE 2

|  | Resist Coating Thickness (μm) | Substrate | PB Temp. (° C.) | PB Time (sec) | PEB Temp. (° C.) | PEB Time (sec) |
|---|---|---|---|---|---|---|
| Example 1 | 0.4 | ARC | 130 | 90 | 140 | 90 |
| Example 2 | 0.4 | ARC | 130 | 90 | 140 | 90 |
| Example 3 | 0.4 | ARC | 130 | 90 | 140 | 90 |
| Example 4 | 0.4 | ARC | 130 | 90 | 140 | 90 |
| Example 5 | 0.4 | ARC | 130 | 90 | 140 | 90 |
| Example 6 | 0.4 | ARC | 130 | 90 | 140 | 90 |
| Example 7 | 0.4 | ARC | 130 | 90 | 140 | 90 |
| Example 8 | 0.4 | ARC | 130 | 90 | 130 | 90 |
| Example 9 | 0.4 | ARC | 130 | 90 | 130 | 90 |
| Example 10 | 0.4 | ARC | 130 | 90 | 130 | 90 |
| Example 11 | 0.4 | ARC | 130 | 90 | 130 | 90 |
| Comparative Example 1 | 0.4 | ARC | 130 | 90 | 140 | 90 |

TABLE 3

|  | Radiation Transmittance (193 nm, %) | Sensitivity (J/m$^2$) | Resolution (μm) | Resolution Defects | Pattern Configuration |
|---|---|---|---|---|---|
| Example 1 | 75 | 79 | 0.15 | 0 | good |
| Example 2 | 72 | 76 | 0.15 | 0 | good |
| Example 3 | 68 | 83 | 0.15 | 0 | good |
| Example 4 | 70 | 84 | 0.15 | 0 | good |
| Example 5 | 71 | 72 | 0.15 | 0 | good |
| Example 6 | 71 | 72 | 0.15 | 0 | good |
| Example 7 | 69 | 75 | 0.15 | 0 | good |
| Example 8 | 73 | 82 | 0.15 | 0 | good |
| Example 9 | 71 | 79 | 0.15 | 0 | good |
| Example 10 | 68 | 83 | 0.15 | 0 | good |
| Example 11 | 66 | 81 | 0.15 | 0 | good |
| Comparative Example 1 | 62 | 150 | 0.15 | 45 | good |

The radiation-sensitive resin composition of the present invention is used as a chemically amplified positive tone resist responsive to short wavelength active radiation, for example, deep ultraviolet rays represented by KrF excimer laser and ArF excimer laser. The resin composition has high transmittance of radiation, exhibits superior basic properties as a resist such as high sensitivity, resolution, and pattern shape, and is capable of producing semiconductors at a high yield without producing resolution defects during microfabrication. The resin composition is expected to be an ideal material in the semiconductor field in which microfabrication technology will further advance in the future.

Obviously, numerous modifications and variations of the present invention are possible in light of the above teachings. It is therefore to be understood that, within the scope of the appended claims, the invention may be practiced otherwise than as specifically described herein.

What is claimed is:

1. A radiation-sensitive resin composition comprising:
    (A) an acid-dissociable group-containing resin which is insoluble or scarcely soluble in alkali and becomes alkali soluble when the acid-dissociable group dissociates, the resin comprising a lactone cyclic structure of the following formula (1):

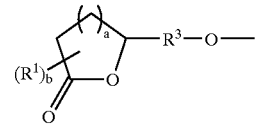

(1)

wherein a is an integer from 1–3, b is an integer from 0–9, $R^3$ represents a linear or branched divalent hydrocarbon group of which the main chain has 1–5 carbon atoms, and $R^1$ represents a monovalent organic group, and
    (B) a photoacid generator.

2. The radiation-sensitive resin composition according to claim 1, wherein the resin of component (A) has a polystyrene-reduced weight average molecular weight by gel permeation chromatography of 5,000 to 100,000.

3. The radiation-sensitive resin composition according to claim 1, wherein the photoacid generator of component (B) is at least one compound selected from the group consisting of an onium salt, halogen-containing compound, diazoketone compound, sulfone compound, and sulfonic acid compound.

4. The radiation-sensitive resin composition according to claim 1, further comprising an acid diffusion controller.

5. The radiation-sensitive resin composition according to claim 4, wherein the acid diffusion controller is a nitrogen-containing organic compound.

6. The radiation-sensitive resin composition according to claim 1, further comprising an alicyclic additive having an acid-dissociating organic group.

7. The radiation-sensitive resin composition according to claim 1, further comprising at least one solvent selected from the group consisting of a linear or branched ketone, cyclic ketone, propylene glycol monoalkyl ether acetate, alkyl 2-hydroxypropionate, and alkyl 3-alkoxypropionate.

8. The radiation-sensitive resin composition according to claim 1, wherein the resin of component (A) further comprises at least one other recurring unit having an alicyclic hydrocarbon skeleton in the main chain and/or side chain.

9. A radiation sensitive resin composition comprising:
    (A) an acid-dissociable group-containing resin which is insoluble or scarcely soluble in alkali and becomes alkali soluble when the acid-dissociable group dissociates, the resin comprising a recurring unit of the following formula (2):

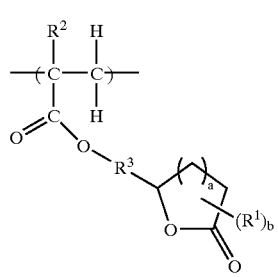

(2)

wherein a is an integer from 1 to 3, b is an integer from 0 to 9, $R^1$ represents a monovalent organic group, $R^2$ represents a hydrogen atom or a methyl group, and $R^3$ represents a linear or branched divalent hydrocarbon group of which the main chain has 1–5 carbon atoms; and
    (B) a photoacid generator.

10. The radiation-sensitive resin composition according to claim 9, wherein the recurring unit of the formula (2) in the resin of component (A) is a recurring unit obtained form an (meth) acrylic acid derivative represented by the following formulas (6-1), (6-2), (6-25), or (6-26):

(6-1)
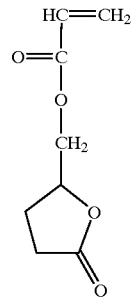

(6-2)
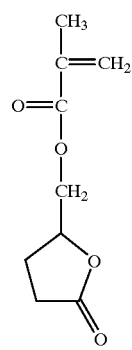

(6-25)
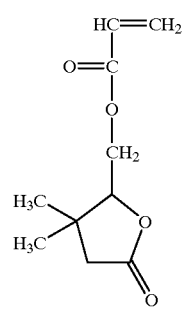

(6-26)
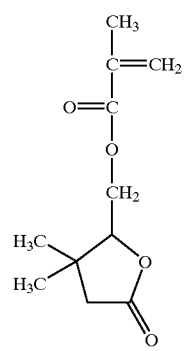

11. The radiation sensitive resin composition according to claim 9, wherein the at least one other recurring unit is selected from the group consisting of the recurring unit of the following formula (8), the recurring unit of the following formula (9), and the recurring unit of the following formula (10):

(8)
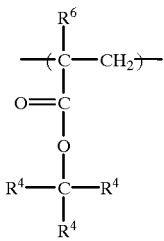

wherein $R^4$ individually represents a linear or branched alkyl group having 1–4 carbon atoms or a monovalent alicyclic hydrocarbon group having 4–20 carbon atoms or a derivative thereof, or any two of $R^4$'s form in combination a divalent alicyclic hydrocarbon group having 4–20 carbon atoms or a derivative thereof, with the remaining $R^4$ being a linear or branched alkyl group having 1–4 carbon atoms or a monovalent alicyclic hydrocarbon group having 4–20 carbon atoms or a derivative thereof, and $R^6$ is a hydrogen atom or a methyl group, (9)
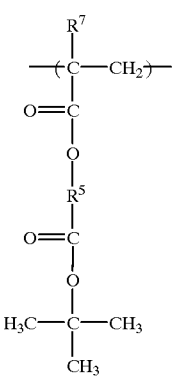

wherein $R^5$ represents a linear or branched divalent hydrocarbon group having 1–4 main chain carbon atoms or a divalent alicyclic hydrocarbon group having 3–15 carbon atoms, and $R^7$ is a hydrogen atom or a methyl group, and

(10)
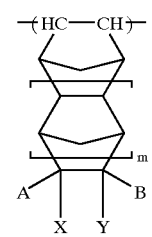

wherein A and B individually represent a hydrogen atom or an acid-dissociating group having 20 or less carbon atoms which dissociates and produces an acidic functional group in the presence of an acid, at least one of A and B being the acid-dissociating group, X and Y individually represent a hydrogen atom or a linear or branched monovalent alkyl group having 1–4 carbon atoms, and m is an integer of 0 to 2.

12. The radiation-sensitive resin composition according to claim 9, wherein the content of the recurring unit of the formula (2) in the resin of component (A) is 10–70 mol %.

13. The radiation-sensitive resin composition according to claim 11, wherein the total of the content of the recurring units of the formulas (8) to (10) in the resin of component (A) is 5–70 mol %.

14. The radiation-sensitive resin composition according to claim 9, wherein the resin of component (A) further comprises at least one other recurring unit having an alicyclic hydrocarbon skeleton in the main chain and/or side chain.

15. A radiation sensitive resin composition comprising:
(A) an acid-dissociable group-containing resin which is insoluble or scarcely soluble in alkali and becomes alkali soluble when the acid-dissociable group dissociates, the resin comprising a recurring unit of the following formula (3):

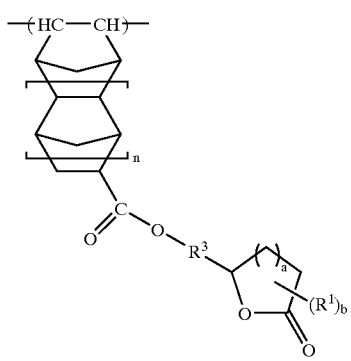

(3)

wherein a is an integer from 1 to 3, b is an integer from 0 to 9, n is an integer from 0 to 2, $R^1$ represents a monovalent organic group, and $R^3$ represents a linear or branched divalent hydrocarbon group of which the main chain has 1–5 carbon atoms; and
(B) a photoacid generator.

16. The radiation sensitive resin composition according to claim 15, wherein the at least one other recurring unit is selected from the group consisting of the recurring unit of the following formula (8), the recurring unit of the following formula (9), and the recurring unit of the following formula (10):

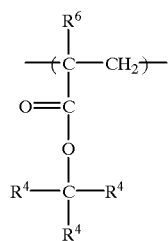

(8)

wherein $R^4$ individually represents a linear or branched alkyl group having 1–4 carbon atoms or a monovalent alicyclic hydrocarbon group having 4–20 carbon atoms or a derivative thereof, or any two of $R^4$s form in combination a divalent alicyclic hydrocarbon group having 4–20 carbon atoms or a derivative thereof, with the remaining $R^4$ being a linear or branched alkyl group having 1–4 carbon atoms or a monovalent alicyclic hydrocarbon group having 4–20 carbon atoms or a derivative thereof, and $R^6$ is a hydrogen atom or a methyl group,

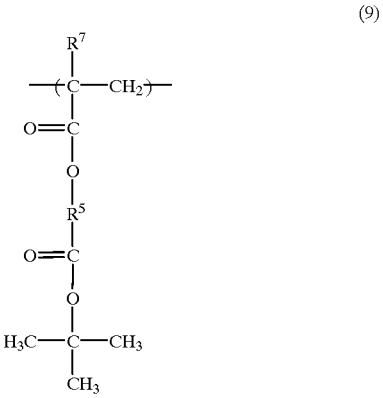

(9)

wherein $R^5$ represents a linear or branched divalent hydrocarbon group having 1–4 main chain carbon atoms or a divalent alicyclic hydrocarbon group having 3–15 carbon atoms, and $R^7$ is a hydrogen atom or a methyl group, and

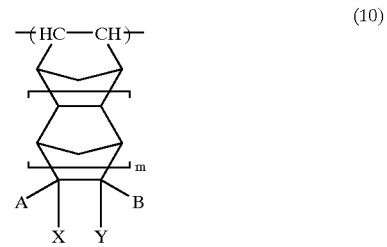

(10)

wherein A and B individually represent a hydrogen atom or an acid-dissociating group having 20 or less carbon atoms which dissociates and produces an acidic functional group in the presence of an acid, at least one of A and B being the acid-dissociating group, X and Y individually represent a hydrogen atom or a linear or branched monovalent alkyl group having 1–4 carbon atoms, and m is an integer of 0 to 2.

17. The radiation-sensitive resin composition according to claim 15, wherein the content of the recurring unit of the formula (3) in the resin of component (A) is 10–70 mol %.

18. The radiation-sensitive resin composition according to claim 16, wherein the total of the content of the recurring units of the formulas (8) to (10) in the resin of component (A) is 5–70 mol %.

19. The radiation-sensitive resin composition according to claim 15, wherein the resin of component (A) further comprises at least one other recurring unit having an alicyclic hydrocarbon skeleton in the main chain and/or side chain.

* * * * *